United States Patent
Arai

(10) Patent No.: US 9,372,410 B2
(45) Date of Patent: Jun. 21, 2016

(54) MEASURING METHOD, STAGE APPARATUS, AND EXPOSURE APPARATUS

(71) Applicant: NIKON CORPORATION, Tokyo (JP)

(72) Inventor: Dai Arai, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 198 days.

(21) Appl. No.: 13/949,720

(22) Filed: Jul. 24, 2013

(65) Prior Publication Data

US 2013/0308108 A1  Nov. 21, 2013

Related U.S. Application Data

(63) Continuation of application No. 12/219,110, filed on Jul. 16, 2008.

(60) Provisional application No. 60/929,988, filed on Jul. 20, 2007.

(30) Foreign Application Priority Data

Jul. 18, 2007  (JP) .................................. 2007-187649

(51) Int. Cl.
G03B 27/42  (2006.01)
G03F 7/20  (2006.01)

(52) U.S. Cl.
CPC .......... *G03F 7/7015* (2013.01); *G03F 7/70341* (2013.01); *G03F 7/70716* (2013.01); *G03F 7/70775* (2013.01); *G03F 7/70858* (2013.01); *Y10T 29/49002* (2015.01)

(58) Field of Classification Search
CPC ............ G03F 7/70775; G03F 7/70858; G03F 7/70341; G03F 7/70716; G03F 7/7015; Y10T 29/49002
See application file for complete search history.

(56) References Cited

U.S. PATENT DOCUMENTS 4,780,617 A  10/1988 Umatate et al.
5,377,044 A * 12/1994 Tomono et al. ............... 359/566
(Continued)

FOREIGN PATENT DOCUMENTS

CN  1723539 A  1/2006
CN  1932650 A  3/2007
(Continued)

OTHER PUBLICATIONS

Jan. 27, 2015 Office Action issued in Japanese Application No. 2014-095567.
(Continued)

*Primary Examiner* — Mesfin T Asfaw
(74) *Attorney, Agent, or Firm* — Oliff PLC

(57) ABSTRACT

An exposure apparatus can mitigate the impact of fluctuations in the refractive index of ambient gas, and improve, for example, stage positioning accuracy. An exposure apparatus radiates an exposure illumination light to a wafer on a wafer stage through a projection optical system, and forms a prescribed pattern on the wafer, and comprises: a scale, which is provided to the wafer stage; a plurality of X heads, which detect information related to the position of the scale; a measurement frame that integrally supports the plurality of X heads and has a coefficient of linear thermal expansion that is smaller than that of the main body of the wafer stage (portions excepting a plate wherein the scale is formed); and a control apparatus that derives information related to the displacement of the wafer stage based on the detection results of the plurality of X heads.

26 Claims, 20 Drawing Sheets

(56) References Cited

U.S. PATENT DOCUMENTS

| | | | |
|---|---|---|---|
| 5,448,332 A | 9/1995 | Sakakibara et al. | |
| 5,469,260 A | 11/1995 | Takagi et al. | |
| 5,552,888 A | 9/1996 | Sogard et al. | |
| 5,610,715 A | 3/1997 | Yoshii et al. | |
| 5,633,698 A | 5/1997 | Imai | |
| 5,760,392 A | 6/1998 | Hisamoto et al. | |
| 5,825,043 A | 10/1998 | Suwa | |
| 5,877,843 A | 3/1999 | Takagi et al. | |
| 6,069,416 A | 5/2000 | Chitayat | |
| 6,285,444 B1 | 9/2001 | Osanai et al. | |
| 6,801,301 B2 | 10/2004 | Miyajima et al. | |
| 7,161,659 B2 | 1/2007 | Van Den Brink et al. | |
| 7,515,281 B2 | 4/2009 | Loopstra et al. | |
| 7,561,270 B2 | 7/2009 | Kwan | |
| 7,692,761 B2 | 4/2010 | Harayama | |
| 7,898,642 B2 | 3/2011 | Kolesnychenko et al. | |
| 7,903,866 B2 | 3/2011 | Van Der Wijst et al. | |
| 8,065,103 B2 | 11/2011 | Kwan | |
| 2002/0021133 A1 | 2/2002 | Okamoto et al. | |
| 2002/0041377 A1 | 4/2002 | Hagiwara et al. | |
| 2002/0054280 A1 | 5/2002 | Tokuda et al. | |
| 2003/0025890 A1 | 2/2003 | Nishinaga | |
| 2003/0071982 A1 | 4/2003 | Miyajima et al. | |
| 2004/0051854 A1 | 3/2004 | Tanaka et al. | |
| 2004/0263809 A1 | 12/2004 | Nakano | |
| 2005/0231694 A1 | 10/2005 | Kolesnychenko et al. | |
| 2005/0237504 A1 | 10/2005 | Nagasaka et al. | |
| 2005/0259234 A1 | 11/2005 | Hirukawa et al. | |
| 2006/0139660 A1 | 6/2006 | Patrick Kwan | |
| 2006/0216650 A1 | 9/2006 | Harayama | |
| 2006/0227308 A1 | 10/2006 | Brink et al. | |
| 2006/0227309 A1 | 10/2006 | Loopstra et al. | |
| 2008/0068568 A1 | 3/2008 | Ebihara et al. | |
| 2008/0240501 A1 | 10/2008 | Van Der Wijst et al. | |
| 2010/0235127 A1 | 9/2010 | Kwan | |

FOREIGN PATENT DOCUMENTS

| | | |
|---|---|---|
| EP | 0 482 553 A2 | 4/1992 |
| EP | 0834773 A2 | 4/1998 |
| EP | 1 420 298 A2 | 5/2004 |
| EP | 1571698 A1 | 9/2005 |
| EP | 1 621 933 A2 | 2/2006 |
| EP | 1760529 A1 | 3/2007 |
| EP | 2006740 A1 | 12/2008 |
| JP | A-61-44429 | 3/1986 |
| JP | A-4-265805 | 9/1992 |
| JP | A-5-129184 | 5/1993 |
| JP | A-5-283313 | 10/1993 |
| JP | A-6-283403 | 10/1994 |
| JP | A-7-270122 | 10/1995 |
| JP | A-08-178694 | 7/1996 |
| JP | A-8-261718 | 10/1996 |
| JP | H10-154659 A | 6/1998 |
| JP | H11-274029 A | 10/1999 |
| JP | A-2001-102279 | 4/2001 |
| JP | A-2001-126977 | 5/2001 |
| JP | A-2001-221607 | 8/2001 |
| JP | A-2001-313250 | 11/2001 |
| JP | A-2002-14005 | 1/2002 |
| JP | A-2005-234359 | 9/2005 |
| JP | A-2006-332656 | 12/2006 |
| JP | 2007-123332 A | 5/2007 |
| JP | A-2007-129194 | 5/2007 |
| JP | A-2007-173718 | 7/2007 |
| JP | 2008-515219 A | 5/2008 |
| KR | 10-2006-0045679 | 5/2006 |
| TW | 200419628 A | 10/2004 |
| WO | WO 99/49504 | 9/1999 |
| WO | WO 2004/053955 A1 | 6/2004 |
| WO | WO 2006/038952 A2 | 4/2006 |
| WO | 2009/043778 A1 | 4/2009 |

OTHER PUBLICATIONS

Feb. 11, 2015 Search Report issued in European Application No. 14175753.4.
Feb. 11, 2015 Search Report issued in European Application No. 14175755.9.
Feb. 12, 2015 Search Report issued in European Application No. 08791197.0.
Aug. 19, 2013 Office Action issued in U.S. Appl. No. 12/219,110.
Sep. 23, 2014 Office Action issued in Korean Application No. 2010-7003290 (with translation.
Sep. 24, 2014 Office Action issued in Japanese Application No. 2009-523655(with translation.
Oct. 4, 2013 Office Action issued in Taiwanese Patent Application No. 097127126 (with translation).
Oct. 22, 2013 Office Action issued in Japanese Patent Application No. 2012-077695 (with translation).
Dec. 1, 2014 Office Action issued in U.S. Appl. No. 12/219,110.
Nov. 10, 2014 Office Action issued in TW Application No. 097127126.
Jan. 17, 2014 Office Action issued in Taiwanese Patent Application No. 097127126 (with translation).
Mar. 4, 2014 Office Action issued in Japanese Patent Application No. 2013-114179 (with translation).
Mar. 5, 2014 Office Action issued in Chinese Patent Application No. 200880025096.X (with translation).
Mar. 20, 2014 Office Action issued in Korean Patent Application No. 10-2010-7003290 (with translation).
Feb. 26, 2013 Office Action issued in Japanese Application No. 2009-523655 (with English Translation).
Apr. 6, 2012 Office Action issued in Chinese Patent Application No. 200880025096.X (with translation).
Mar. 24, 2011 Office Action issued in Chinese Application No. 200880025096.X (with translation).
May 3, 2011 Office Action issued in Singapore Application No. 201000328-3.
International Search Report dated Oct. 14, 2008 in International Patent Application No. PCT/JP2008/062802 (with translation).
Written Opinion of the International Searching Authority dated Oct. 14, 2008 International Patent Application No. PCT/JP2008/062802 (with translation).
Apr. 5, 2011 Office Action issued in U.S. Appl. No. 12/219,110.
Jan. 6, 2012 Office Action issued in U.S. Appl. No. 12/219,110.
Dec. 18, 2012 Office Action issued in U.S. Appl. No. 12/219,110.
Jul. 14, 2015 Advisory Action issued in U.S. Appl. No. 12/219,110.
Apr. 21, 2015 Office Action issued in U.S. Appl. No. 12/219,110.
Aug. 25, 2015 Office Action issued in Japanese Patent Application No. 2009-523655.
Sep. 8, 2015 Office Action issued in Chinese Patent Application No. 201410270424.X.
Sep. 8, 2015 Office Action issued in Japanese Patent Application No. 2015-003029.
Oct. 27, 2015 Office Action issued in Chinese Patent Application No. 201410270432.4.
Nov. 5, 2015 Office Action issued in U.S. Appl. No. 13/949,721.

* cited by examiner

FIG. 16A
FIG. 16B
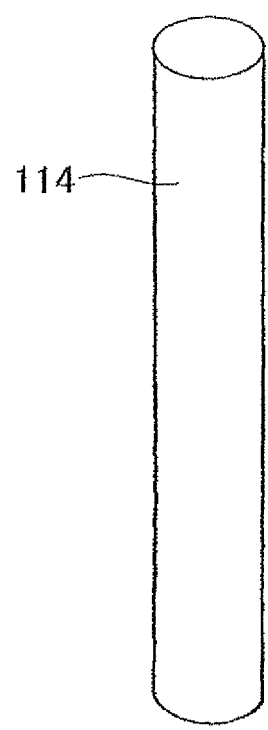
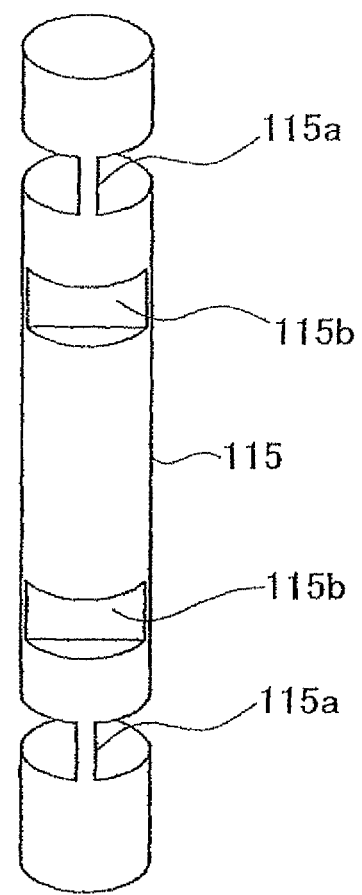

MEASURING METHOD, STAGE APPARATUS, AND EXPOSURE APPARATUS

CROSS-REFERENCE TO RELATED APPLICATION

This application is a continuation of application Ser. No. 12/219,110, filed Jul. 16, 2008, which claims priority to Japanese Patent Application No. 2007-187649, filed Jul. 18, 2007 and to U.S. provisional application No. 60/929,988, filed Jul. 20, 2007, the contents of which are incorporated herein by reference.

BACKGROUND

1. Field of the Invention

The present invention relates to: a measurement technology and a stage technology that measure the position of a movable member, e.g., a stage, that is for moving an object; an exposure technology that uses the stage technology to expose the object; and a device fabrication technology that uses the exposure technology to fabricate a device, e.g., a semiconductor device or a liquid crystal display device.

2. Description of Related Art

Lithography for fabricating devices (electronic devices, microdevices, and the like), such as semiconductor devices and liquid crystal display devices, employs an exposure apparatus (e.g., a static exposure type—a full field exposure type—projection exposure apparatus such as a stepper, or a scanning exposure type projection exposure apparatus—scanning exposure apparatus—such as a scanning stepper) that exposes a wafer (or a glass plate and the like), which is coated with a photoresist, by projecting a circuit pattern formed in a reticle (or a photomask and the like) onto the wafer through a projection optical system. In order to reduce positional distortion and overlay error in a circuit pattern fabricated with such an exposure apparatus, laser interferometers, which use frequency stabilized lasers as light sources, are conventionally used to measure the position of the stage that positions or moves the wafer and the like.

With a laser interferometer, the refractive index of the gas in the optical path, along which the laser light propagates, fluctuates depending on, for example, the temperature, the pressure, and the humidity of the gas, and these fluctuations in turn cause fluctuations in the measurement values of the interferometer (called interferometer turbulence). Accordingly, with an exposure apparatus, it is the practice in the conventional art to reduce interferometer turbulence by using a ventilation system that ventilates temperature controlled gas to the optical path of the measurement beam of the interferometer in order to stabilize the temperature of the gas in that optical path. An exposure apparatus has recently been proposed (e.g., referred to Japanese Unexamined Patent Application Publication No. H05-2883313, and Japanese Unexamined Patent Application Publication No. H08-261718) that uses a tubular cover or the like to cover at least part of the optical path of the measurement beam in order to increase the temperature stability of the gas in the optical path of the measurement beam of the laser interferometer.

As discussed above, it is necessary to take measures against turbulence when using a laser interferometer. Nevertheless, when a stage to be measured—particularly a wafer stage of a scanning type exposure apparatus—is moved at a high speed in the vertical and transverse directions, there is a problem in that the movement of the stage causes irregular fluctuations in the gas flow, and consequently interferometer turbulence remains to a certain extent.

A purpose some aspects of the present invention is to provide a measurement technology and a stage technology that can mitigate the impact of fluctuations in the refractive index of ambient gas, an exposure technology that can improve, for example, stage positioning accuracy using the stage technology, and a device fabrication technology that uses the exposure technology.

SUMMARY

According to a first aspect of the present invention, there is provided a measuring method that measures a displacement of a movable member with respect to a predetermined member, the method comprising: providing a scale to one of the predetermined member and the movable member and providing a plurality of detectors to the other one, the detectors being capable of detecting the scale; supporting the scale or the plurality of detectors provided to the predetermined member with a support member, a coefficient of linear thermal expansion of which is smaller than that of the movable member; and measuring the displacement of the movable member based on the detection results of the plurality of detectors.

According to a second aspect of the present invention, there is provided a measuring method that measures a displacement of a movable member, the method comprising: integrally supporting a plurality of detectors with a support member; detecting a scale provided to the movable member by means of the plurality of detectors; and measuring the displacement of the movable member based on the detection results of the plurality of detectors, wherein the support member is attached to a base member that has a coefficient of linear thermal expansion larger than that of the support member via a plurality of flexural members, and the tip parts of the flexural members can be displaced with respect to the base member in directions along the surface of the scale.

According to a third aspect of the present invention, there is provided a stage apparatus that is capable of positioning a stage with respect to a predetermined member, the apparatus comprising: a scale, which is provided to one of the stage and the predetermined member; a plurality of detectors, which are provided to another one of the stage and the predetermined member and detect information related to the position of the scale; a support member that supports the plurality of detectors, which are provided to the stage or the predetermined member, and that has a coefficient of linear thermal expansion that is smaller than that of the stage; and a control apparatus that derives information related to a displacement of the stage based on detection results of the plurality of detectors.

According to a fourth aspect of the present invention, there is provided an exposure apparatus that radiates an exposure light to a substrate and forms a prescribed pattern on the substrate, the apparatus comprising: a stage apparatus according to an aspect of the present invention, wherein the substrate is positioned by means of the stage apparatus.

According to a fifth aspect of the present invention, there is provided an exposure apparatus that radiates an exposure light to a substrate, which is held by a moveable stage, and forms a prescribed pattern on the substrate, the apparatus comprising: a scale, which is provided to the stage; a plurality of detectors, which detect information related to the position of the scale; a support member that integrally supports the plurality of detectors; a base member, the coefficient of linear thermal expansion of which is larger than that of the support member; a coupling mechanism that couples the support member to the base member in the state wherein the support member can be displaced in directions along a surface of the scale; and a control apparatus that derives information related to the displacement of the stage based on detection results of the plurality of detectors; wherein, the coupling mechanism couples the support member and the base member, and comprises a plurality of flexural members, the tip parts of which can be displaced in directions along the surface of the scale.

According to a sixth aspect of the present invention, there is provided a device fabricating method that includes a lithographic process, wherein an exposure apparatus according to an aspect of the present invention is used in the lithographic process.

BRIEF DESCRIPTION OF THE DRAWINGS

FIG. 16A shows a narrow rod shaped member.

FIG. 16B shows a flexural member wherein slotted parts are formed.

DESCRIPTION OF EMBODIMENTS

First Embodiment

The following explains a preferred first embodiment of the present invention, referencing FIG. 1 through FIG. 11.

Figure 1:
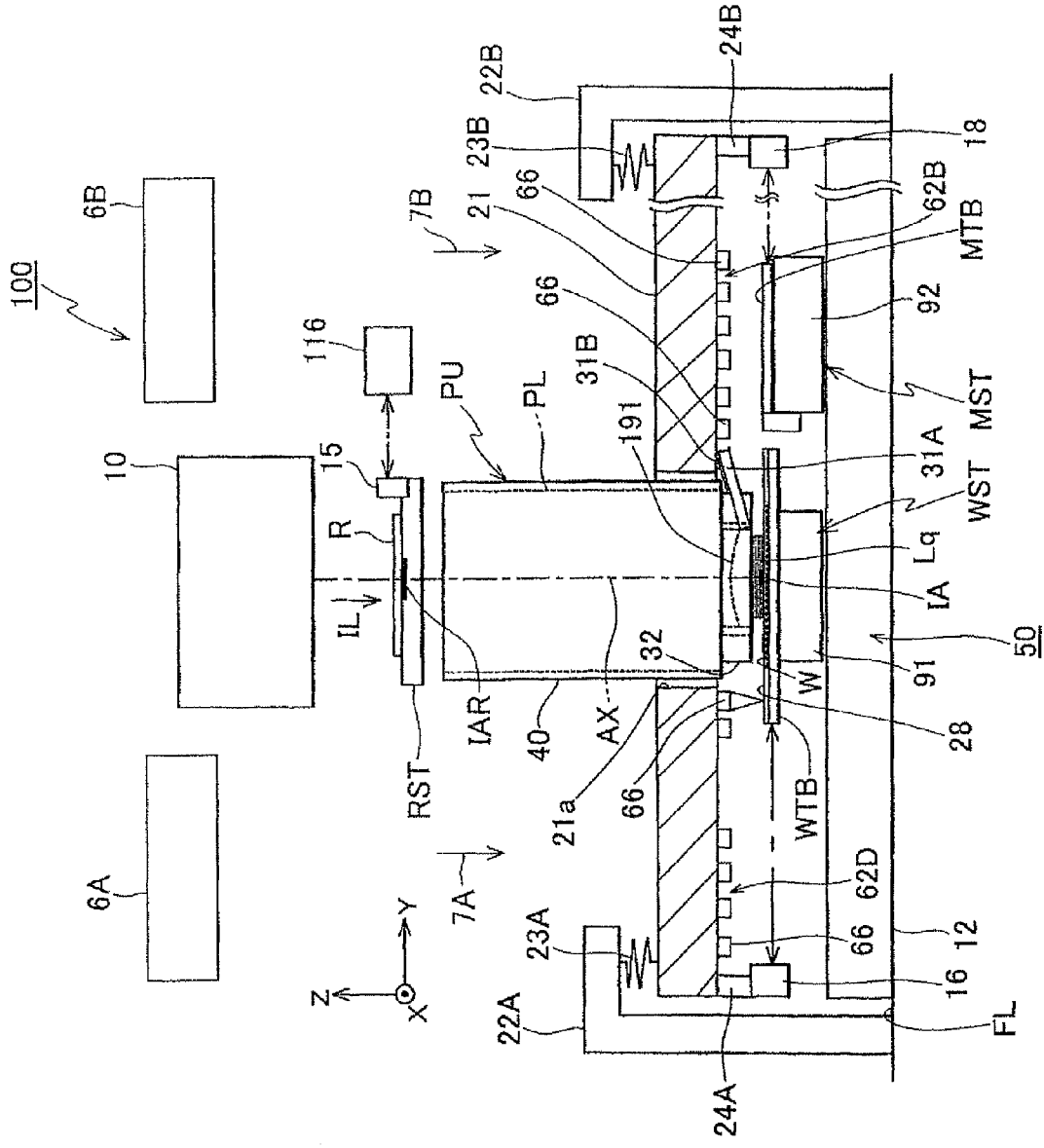
FIG. 1 is a partial cutaway view that shows a schematic configuration of an exposure apparatus according to a first embodiment.

FIG. 1 schematically shows the configuration of an exposure apparatus 100 according to the present embodiment. The exposure apparatus 100 is a step-and-scan-type scanning exposure apparatus, i.e., a so-called scanner. With the present embodiment as discussed below, a projection optical system PL is provided; furthermore, in the explanation below, the Z axis lies in the directions that are parallel to an optical axis AX of the projection optical system PL, the Y axis lies in the directions within a plane that is orthogonal thereto and wherein a reticle and a wafer are scanned relative to one another, the X axis lies in the directions that are orthogonal to the Z axis and the Y axis, and the θx, the θy, and the θz directions lie in rotational (inclined) directions around the X axis, the Y axis and the Z axis, respectively.

The exposure apparatus 100 comprises: an illumination system 10; a reticle stage RST that holds a reticle R, which is illuminated by illumination light (exposure light) IL for exposure from the illumination system 10; a projection unit PU that comprises the projection optical system PL, which projects the illumination light IL that emerges from the reticle R onto a wafer W; a stage apparatus 50, which comprises a wafer stage WST and a measurement stage MST; and a control system, which controls these constituent elements. The wafer W is mounted on the wafer stage WST.

As disclosed in, for example, Japanese Unexamined Patent Application Publication No. 2001-313250 (corresponding U.S. Patent Application Publication No. 2003/0025890), the illumination system 10 comprises: a light source; and an illumination optical system that has, for example, a luminous flux intensity uniformizing optical system, which includes an optical integrator (e.g., a fly-eye lens, a rod integrator, i.e., an internal reflection type integrator, and a dioptric element), and a reticle blind (none of which are shown). The illumination system 10 illuminates a slit shaped illumination area IAR, which is defined by a reticle blind, on the reticle R with the illumination light IL at a substantially uniform luminous flux intensity. In one example, ArF excimer laser light (193 nm wavelength) is used as the illumination light IL. Furthermore, examples of light sources that can be used as the illumination light include KrF excimer laser light (248 nm wavelength), $F_2$ laser light (157 nm wavelength), the higher harmonics of a YAG laser, the higher harmonics of a solid state laser (e.g., a semiconductor laser), and the bright lines (e.g., the i line) of a mercury lamp.

The reticle R, the pattern surface (lower surface) of which has a circuit pattern or the like formed therein, is fixed to the reticle stage RST by, for example, vacuum chucking. A reticle stage drive system 11 (FIG. 7) that includes, for example, linear motors is capable of driving the reticle stage RST finely within an XY plane and at a specified scanning speed in scanning directions (Y directions).

Figure 7:
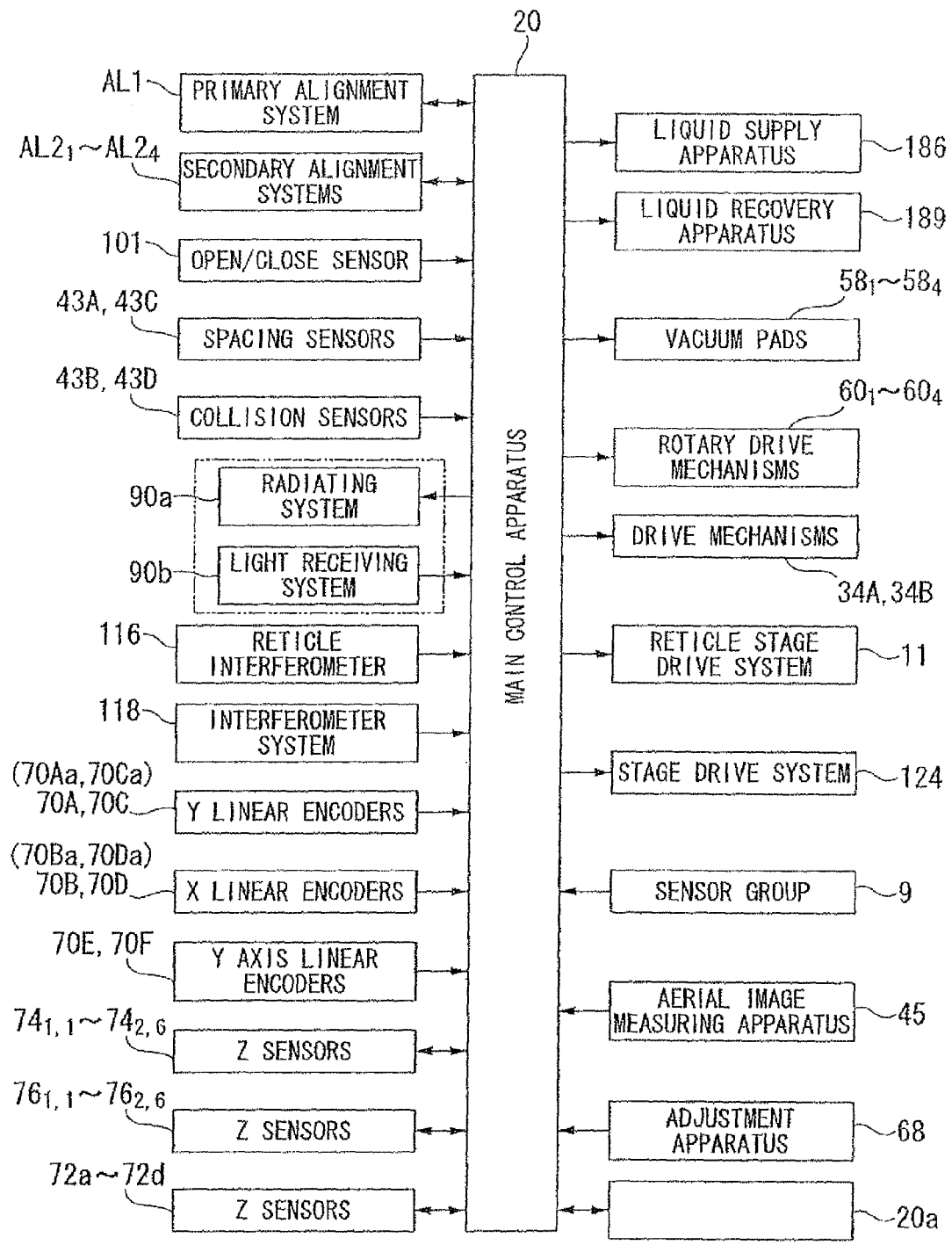
FIG. 7 is a block diagram that shows the principal components of a control system of the exposure apparatus according to a first embodiment.

Reticle interferometers 116, which comprise laser interferometers, continuously detect the position (including rotation in the θz directions) of the reticle stage RST (FIG. 1) in its plane of motion via movable mirrors 15 (which may be reflecting surfaces that are formed by mirror polishing end surfaces of the stage) with a resolving power of, for example, approximately 0.5-0.1 nm. The measurement values of the reticle interferometers 116 are sent to a main control apparatus 20 (FIG. 7). The main control apparatus 20 calculates the position of the reticle stage RST in at least the X, the Y, and the θz directions based on the measurement values of the reticle interferometers 116 and controls the position and velocity of the reticle stage RST by controlling the reticle stage drive part 11 based on the calculation results. Furthermore, the reticle interferometers 116 may also be capable of measuring the position of the reticle stage RST in at least one of the Z, the θx, and the θy directions.

In FIG. 1, the projection unit PU, which is disposed below the reticle stage RST, includes the projection optical system PL, which comprises a lens barrel 40 and a plurality of optical elements that are held therein with prescribed positional relationships. For example, a dioptric system that includes a plurality of lens elements arrayed along the optical axis AX is used as the projection optical system PL. The projection optical system PL is, for example, double telecentric, and has a prescribed projection magnification β (e.g., a reduction magnification of 1:4, 1:5, or 1:8). When the illumination system 10 illuminates the illumination area IAR with the illumination light IL, the illumination light IL that passes through the reticle R travels through the projection optical system PL, and thereby an image of the reticle R circuit pattern within the illumination area IAR is formed in an exposure area IA (an area that is conjugate to the illumination area IAR) on the wafer W, the front surface of which is coated with resist (a photosensitive agent).

Furthermore, with the exposure apparatus 100, exposures are performed wherein an immersion method is used. In this case, a catadioptric system that includes mirrors and lenses may be used as the projection optical system PL in order to avoid increasing the size thereof. Furthermore, in addition to a photosensitive layer, a protective film (a topcoat film) may be formed on the wafer W that protects, for example, the wafer or the photosensitive layer.

In addition, in order to perform an exposure wherein the liquid immersion method is used, the exposure apparatus 100 is provided with a nozzle unit 32, which constitutes part of a local liquid immersion apparatus, that is disposed so that it surrounds the circumference of a lower end part of the lens barrel 40 that holds an objective 191, which is the optical element of the plurality of optical elements that constitute the projection optical system PL that is most on the image plane side (wafer W side) thereof.

In FIG. 1, the nozzle unit 32 has a supply port, which is capable of supplying liquid Lq for exposure, and a recovery port, which is capable of recovering the liquid Lq. A porous member (mesh) is disposed in the recovery port. The lower surface of the nozzle unit, which is capable of opposing the front surface of the wafer W, includes: a lower surface of the porous member thereof; and a flat surface that is disposed so that it surrounds an opening through which the illumination light IL passes. In addition, the supply port is connected to a liquid supply apparatus 186 (refer to FIG. 7), which is capable of feeding the liquid Lq, via a supply passageway, which is formed in the interior of the nozzle unit 32, and a supply pipe 31A. The recovery port is connected to a liquid recovery apparatus 189 (refer to FIG. 7), which is capable of recovering at least the liquid Lq, via a recovery passageway, which is formed in the interior of the nozzle unit 32, and a recovery pipe 31B.

The liquid supply apparatus 186 comprises: a tank of liquid; a pressure pump; a temperature control apparatus; and a flow control valve, which turns the supply of the liquid to the supply pipe 31A on and off; furthermore, the liquid supply apparatus 186 is capable of feeding clean, temperature adjusted liquid Lq for exposure. The liquid recovery apparatus 189 comprises: a tank of liquid; a suction pump; and a flow control valve that controls the recovery of the liquid Lq via the recovery pipe 31B; furthermore, the liquid recovery apparatus 189 is capable of recovering the liquid Lq. Furthermore, the tanks of liquid, the pressure (suction) pumps, the temperature control apparatuses, the control valves, and the like do not all necessarily have to be provided by the exposure apparatus 100; for example, at least some of these constituent elements can be replaced by a facility at, for example, the plant where the exposure apparatus 100 is installed.

The main control apparatus 20 controls the operation of the liquid supply apparatus 186 and the operation of the liquid recovery apparatus 189 (FIG. 7). The liquid Lq for exposure that is fed from the liquid supply apparatus 186 (FIG. 7) flows through the supply pipe 31A and the supply passageway of the nozzle unit 32 (FIG. 1), and is then supplied to an optical path space of the illumination light IL via the supply port. In addition, the liquid Lq that is recovered via the recovery port by driving the liquid recovery apparatus 189 (FIG. 7) flows through the recovery passageway of the nozzle unit 32 (FIG. 1) and is then recovered by the liquid recovery apparatus 189 via the recovery pipe 31B. The main control apparatus 20 (FIG. 7) performs the operation wherein the nozzle unit 32 supplies the liquid Lq via the supply port and the operation wherein the nozzle unit 32 recovers the liquid Lq via the recovery port in parallel, and thereby forms an immersion space of the liquid Lq so that an immersion area 14 (refer to FIG. 3), which includes the optical path space of the illumination light IL between the objective 191 and the wafer W (FIG. 1), is filled with the liquid Lq.

In the present embodiment, pure water (water), through which ArF excimer laser light (light with a wavelength of 193 nm) transmits, is used as the liquid Lq for exposure. Pure water is advantageous in that it can be easily obtained in large quantities at, for example, semiconductor fabrication plants, and does not adversely affect the photoresist on the wafer, the optical lenses, and the like. The refractive index n of water with respect to the ArF excimer laser light is substantially 1.44. The wavelength of the illumination light IL in water is shortened to approximately 134 nm (193 nm×1/n), which improves resolution.

As can be understood from the explanation above, in the present embodiment, the local liquid immersion apparatus comprises the nozzle unit 32, the liquid supply apparatus 186, the liquid recovery apparatus 189, as well as the supply pipe 31A and the recovery pipe 31B for the liquid Lq. Furthermore, part of the local liquid immersion apparatus, e.g., at least the nozzle unit 32, may be supported so that it is suspended from a main frame (including a base plate that supports the lens barrel as discussed above) that holds the projection unit PU, and may be provided to a frame member that is separate from the main frame. In the present embodiment, the nozzle unit 32 is provided via a coupling member (not shown) to a measurement frame 21, which is supported so that it is suspended independently of the projection unit PU. In this case, the projection unit PU does not have to be supported so that it is suspended.

Furthermore, even if the measurement stage MST is positioned below the projection unit PU (FIG. 1), it is still possible to fill the space between a measurement table MTB (discussed below) and the objective 191 with water in the same manner as mentioned above. Furthermore, in the explanation above, one liquid supply pipe (nozzle) and one liquid recovery pipe (nozzle) are provided as an example, but the present invention is not limited thereto; for example, a configuration may be adopted that comprises numerous nozzles, as disclosed in, for example, PCT International Publication WO99/49504—provided that such nozzles can be laid out while considering their relationships with surrounding members. In other words, any configuration may be adopted as long as it is possible to supply the liquid to the space between the wafer W and the lowest end optical member (objective) 191 that constitutes the projection optical system PL. For example, the liquid immersion mechanism disclosed in PCT International Publication WO 2004/053955 or the liquid immersion mechanism disclosed in European Patent Application Publication No. 1,420,298 can be adapted to the exposure apparatus of the present embodiment.

Returning to FIG. 1, the stage apparatus 50 comprises: the wafer stage WST and the measurement stage MST, which are disposed above a base plate 12; an interferometer system 118 (refer to FIG. 7) that includes Y axis interferometers 16, 18, which measure the positions of the stages WST, MST; an encoder system (discussed below), which is used in the measurement of the position of the wafer stage WST when, for example, an exposure is to be performed; and a stage drive system 124 (refer to FIG. 7) that drives the stages WST, MST and a Z and leveling mechanism (discussed below).

A plurality of noncontact bearings (not shown), e.g., air pads that constitute vacuum primed aerostatic bearings, are provided to the bottom surfaces of the wafer stage WST and the measurement stage MST, and the static pressure of the pressurized air that is blown out from the air pads toward the upper surface of the base plate 12 noncontactually supports the wafer stage WST and the measurement stage MST above the base plate 12 with a clearance of approximately several microns. In addition, the stage drive system 124 (FIG. 7) can drive the stages WST, MST independently in the two-dimensional directions—in the Y directions and the X directions.

Figure 2:
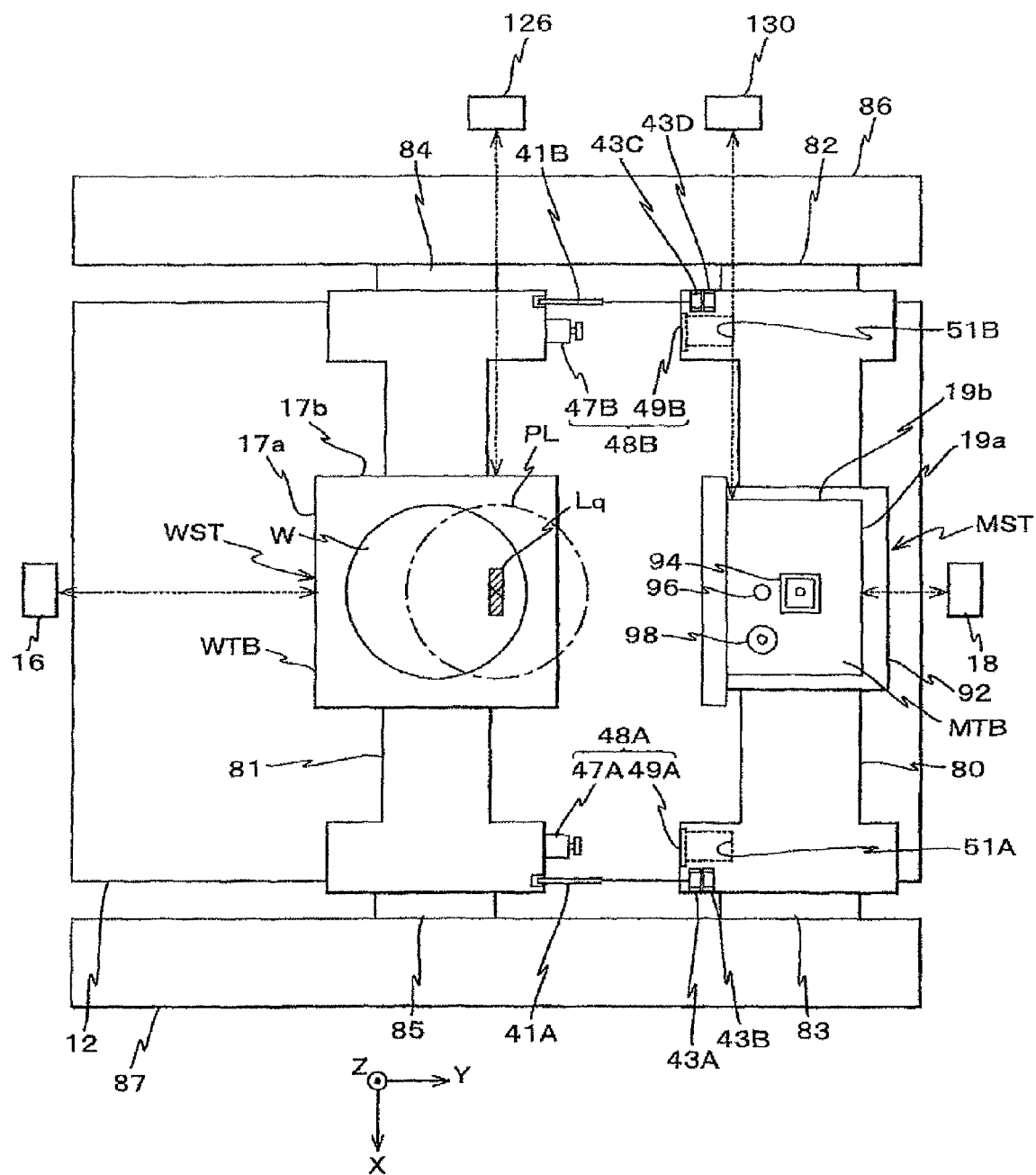
FIG. 2 is a plan view that shows a stage apparatus of FIG. 1.

In further detail, as shown in the plan view of FIG. 2, two Y axis stators 86, 87, which extend in the Y directions, are disposed on a floor surface on opposite sides of the base plate 12 so that the base plate 12 is interposed therebetween. Each of the Y axis stators 86, 87 comprises a magnetic pole unit with a built-in permanent magnet group that comprises multiple sets of north pole magnets and south pole magnets that are disposed alternately and at prescribed intervals in, for example, the Y directions. Two Y axis sliders 82, 84 and two Y axis sliders 83, 85 are provided to the Y axis stators 86, 87, respectively, in noncontactually engaged states. Namely, a total of four Y axis sliders 82, 84, 83, 85 are in states wherein they are inserted in the interior spaces of the Y axis stators 86, 87, which are U shaped in the XZ cross sectional plane, and are noncontactually supported by the corresponding Y axis stators 86, 87 via air pads (not shown) with a clearance of, for example, approximately several microns. Each of the Y axis sliders 82, 84, 83, 85 comprises an armature coil unit with built-in armature coils that are disposed at prescribed intervals in, for example, the Y directions. Namely, in the present embodiment, the Y axis sliders 82, 84, each of which comprises an armature unit, and the Y axis stator 86, which comprises a magnetic pole unit, constitute moving coil type Y axis linear motors. Likewise, the Y axis sliders 83, 85 and the Y axis stator 87 constitute moving coil type Y axis linear motors. Hereinbelow, the abovementioned four Y axis linear motors are assigned the same symbols as the sliders 82, 84, 83, 85, and are properly called the Y axis linear motors 82, 84, 83, 85.

Of the four Y axis linear motors mentioned above, the sliders 82, 83 of the two Y axis linear motors 82, 83 are fixed to one end and another end, respectively, of an X axis stator 80, which extends in the X directions, in the longitudinal directions. In addition, the sliders 84, 85 of the remaining two Y axis linear motors 84, 85 are fixed to one end and another end, respectively, of an X axis stator 81, which extends in the X directions. Accordingly, the two pairs of Y axis linear motors 82, 83, 84, 85, one pair for each of the X axis stators 80, 81, drive the X axis stators 80, 81 along the Y axis.

Each of the X axis stators 80, 81 comprises an armature coil unit that has built-in armature coils, which are disposed at prescribed intervals in, for example, the X directions. The X axis stator 81 is provided in the state wherein it is inserted in an opening (not shown) that is formed in a stage main body 91 (refer to FIG. 1) that constitutes part of the wafer stage WST. A magnetic pole unit, which comprises a permanent magnet group that comprises multiple sets of north pole magnets and south pole magnets disposed alternately at prescribed intervals in, for example, the X directions, is provided in the inner part of the opening of the substrate stage 91. This magnetic pole unit and the X axis stator 81 constitute a moving magnet type X axis linear motor that drives the stage main body 91 in the X directions. Likewise, the X axis stator 80 is provided in the state wherein it is inserted in an opening that is formed in a stage main body 92 that constitutes the measurement stage MST. A magnetic pole unit that is similar to the one on the wafer stage WST side (the stage main body 91 side) is provided inside the abovementioned opening of the stage main body 92. This magnetic pole unit and the X axis stator 80 constitute a moving magnet type X axis linear motor that drives the measurement stage MST in the X directions.

In the present embodiment, a main control apparatus 20 shown in FIG. 7 controls each of the abovementioned linear motors that constitute the stage drive system 124. Furthermore, the linear motors are not limited to either moving magnet types or moving coil types, and some other types may be appropriately selected as needed. Furthermore, it is possible to control yawing (rotation in the θz directions) of the wafer stage WST (or the measurement stage MST) by making the thrust that is generated by each of the two Y axis linear motors 84, 85 (or 82, 83) slightly different.

The wafer stage WST comprises the stage main body 91 discussed above and a wafer table WTB, which is mounted on the stage main body 91 via the Z and leveling mechanism (e.g., a voice coil motor; not shown), that is finely driven relative to the stage main body 91 in the Z, the θx, and the θy directions.

A wafer holder (not shown), which holds the wafer W by vacuum chucking or the like, is provided on the wafer table WTB. The wafer holder may be formed integrally with the wafer table WTB; however, in the present embodiment, the wafer holder and the wafer table WTB are configured separately, e.g., the wafer holder is fixed to a recessed part of the wafer table WTB by vacuum chucking. In addition, a plate (liquid repellent plate) 28 is provided to the upper surface of the wafer table WTB and has a front surface (liquid repellent surface) that is substantially flush with the front surface of the wafer W that is mounted on the wafer holder and that has been treated so that it liquid repellent with respect to the liquid Lq; furthermore, the plate 28 has a rectangular external shape (contour); in addition, a circular opening that is larger than the wafer holder (the wafer mounting area) is formed at a center part of the plate 28. The plate 28 is made of a material that has a low coefficient of thermal expansion, e.g., glass, a glass ceramic, or a ceramic (Zerodur, which is the name of a product made by Schott Nippon K.K., $Al_2O_3$, TiC, or the like); in addition, a liquid repellent film that is made of, for example, a fluororesin material, a fluorine based resin material such as polytetrafluoroethylene (Teflon™), an acrylic based resin material, or a silicone based resin material is formed on the front surface of the plate 28.

Figure 5A:
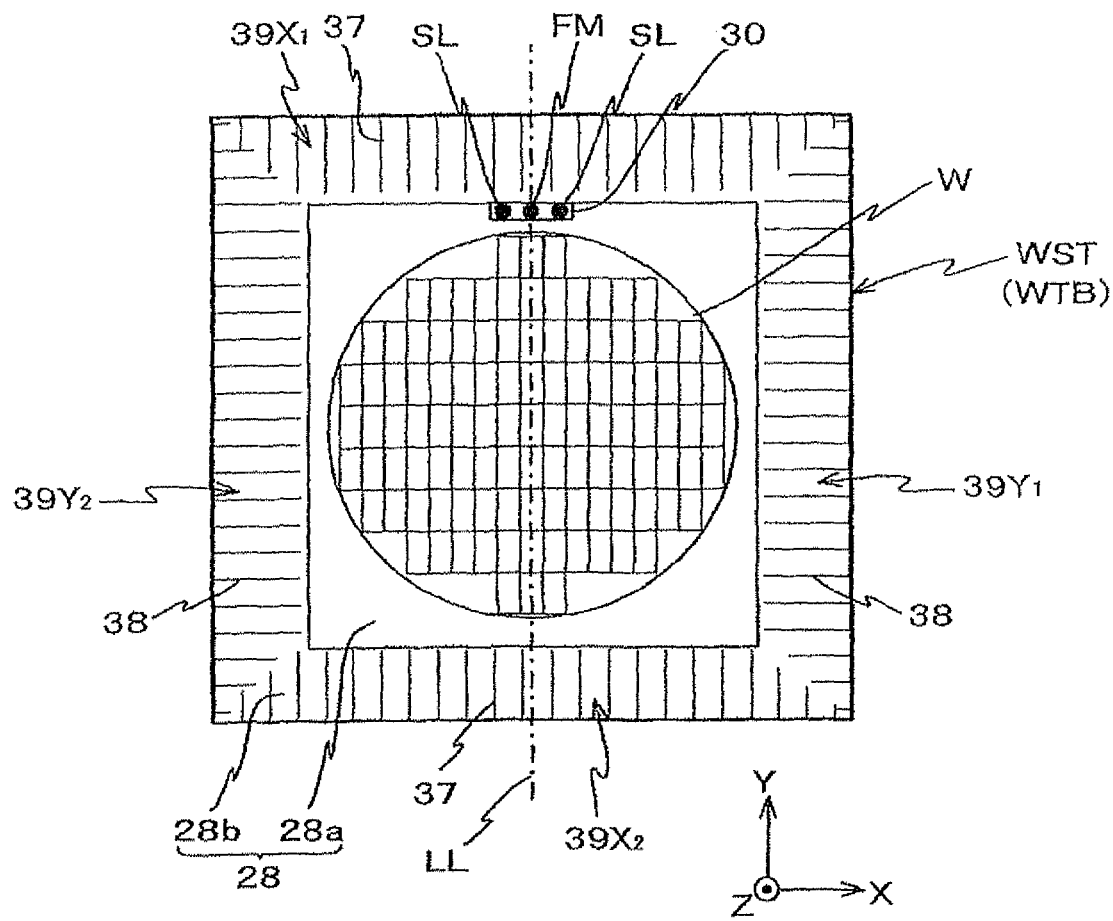
FIG. 5A includes is a plan view that shows a wafer stage.

Furthermore, the plate 28 comprises: a first liquid repellent area 28a, which has a rectangular external shape (contour) and surrounds the circular opening as shown in the plan view of the wafer table WTB (the wafer stage WST) in FIG. 5A; and a rectangular frame shaped (annular) second liquid repellent area 28b, which is disposed around the first liquid repellent area 28a. At least part of the immersion area 14 (refer to FIG. 3), which juts out from the front surface of the wafer when, for example, an exposure operation is performed, is formed on the first liquid repellent area 28a, and scales for the encoder system, which are discussed below, are formed on the second liquid repellent area 28b. Furthermore, at least part of the front surface of the plate 28 may not be flush with the front surface of the wafer, i.e., it may be at a different height. In addition, the plate 28 may be a single plate; however, in the present embodiment, the plate 28 comprises a plurality of plates, e.g., a combination of first and second liquid repellent areas 28a, 28b and corresponding first and second liquid repellent plates. Furthermore, the liquid Lq in the present embodiment is pure water; consequently, in one example, the repellent areas 28a, 28b are each provided with a water repellent coat.

In this case, the illumination light IL is radiated to the inner side first liquid repellent area 28a, but is virtually not radiated to the outer side second liquid repellent area 28b. In consideration of this point, in the present embodiment, a water repellent coat that is sufficiently resistant to the illumination light IL (in this case, vacuum ultraviolet region light) is applied to the front surface of the first liquid repellent area 28a, while a water repellent coat of inferior resistance with respect to the illumination light IL compared with that of the first liquid repellent area 28a is applied to the front surface of the second liquid repellent area 28b.

In addition, as can be seen in FIG. 5A, an oblong notch is formed on the end part of the first liquid repellent area 28a on the +Y direction side and at the center part of the first liquid repellent area 28a in the X directions; furthermore, a measurement plate 30 is embedded in the oblong space (in the notch), which is surrounded by the notch and the second liquid repellent area 28b. A fiducial mark FM is formed at the center of the measurement plate 30 in the longitudinal directions (along a center line LL of the wafer table WTB), and two slit patterns (slit shaped measurement patterns) SL for aerial image measurement, which are disposed symmetrically with respect to the center of the fiducial mark, are formed on one side and another side of the fiducial mark in the X directions. Examples of patterns that can be used for each of the slit patterns SL include: an L-shaped slit pattern, the sides of which extend in the X and Y directions; and two linear slit patterns that extend in the X and Y directions, respectively.

Figure 5B:
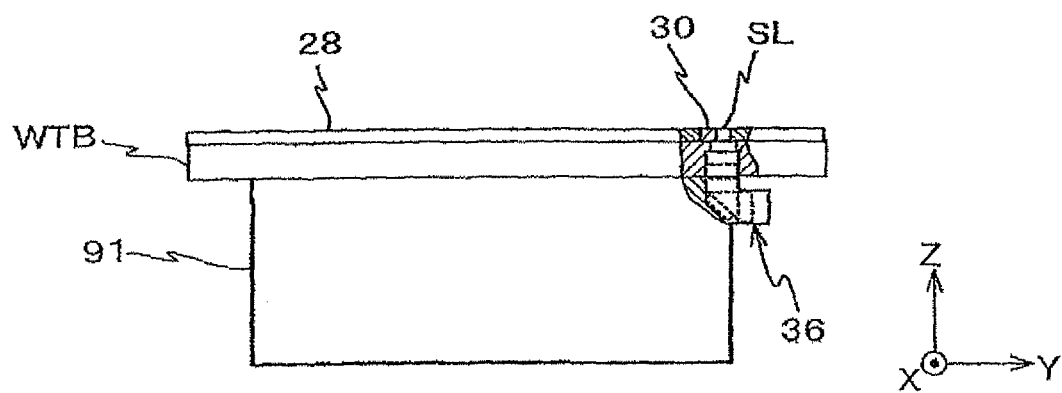
FIG. 5B is a partial cross sectional side view of the wafer stage.

Furthermore, as shown in FIG. 5B, an L-shaped casing, wherein a light transmitting system 36 is housed that comprises an optical system that includes an objective, a mirror, and a relay lens, is installed in a partially buried state inside the wafer stage WST below the abovementioned slit patterns SL so that it passes through part of the interior of the stage main body 91 from the wafer table WTB. Although not shown, two light transmitting systems 36 are provided that correspond to the abovementioned two aerial image measurement slit patterns SL. Each of the light transmitting systems 36 guides the illumination light IL that transmits through the corresponding aerial image measurement slit pattern SL along an L-shaped path and then emits the illumination light IL in the Y direction.

Furthermore, numerous grating lines 37, 38 are formed directly in the upper surface of the second liquid repellent area 28b along the four sides thereof with a prescribed pitch. In greater detail, Y scales $39Y_1$, $39Y_2$ are formed in the areas that are on opposite sides of the second liquid repellent area 28b in the X directions (on both the left and right sides in FIG. 5A). Each of the Y scales $39Y_1$, $39Y_2$ comprises a reflecting type grating (e.g., a phase diffraction grating), which is disposed with its direction of periodicity in the Y directions, wherein the grating lines 38 are formed in directions (Y directions) that are parallel to the Y axis at a prescribed pitch and are disposed so that their longitudinal directions are in the X directions.

Similarly, X scales $39X_1$, $39X_2$ are formed in the areas that are on opposite sides of the second liquid repellent area 28b in the Y directions (on both the upper and lower sides in FIG. 5A). Each of the X scales $39X_1$, $39X_2$ comprises a reflecting type grating (e.g., a phase diffraction grating), which is disposed with its direction of periodicity in the X directions, wherein the grating lines 37 are formed in directions (X directions) that are parallel to the X axis at a prescribed pitch and are disposed so that their longitudinal directions are in the Y directions.

A scale—wherein a reflecting type diffraction grating is formed as, for example, a hologram on the front surface of the second liquid repellent area 28b—is used for each of the scales $39Y_1$, $39Y_2$, $39X_1$, $39X_2$. In this case, a grating, which comprises narrow slits, grooves, or the like, is engraved as graduations with a prescribed spacing (a pitch) in each of the scales. The types of diffraction gratings that are used in the scales are not limited; for example, grooves may be formed mechanically; in addition, interference fringes may be formed on, for example, a photosensitive resin by printing the interference fringes thereon. However, each of the scales is created by engraving the abovementioned diffraction grating graduations on, for example, a thin, plate shaped glass with a pitch of 138 nm to 4 μm, e.g., a 1-μm pitch. Each of these scales is covered by the liquid repellent film (water repellent film) discussed above. Furthermore, for the sake of convenience in the drawing, the pitch of each the gratings shown in FIG. 5A is much larger than the actual pitch. The same applies to other drawings as well.

Thus, in the present embodiment, the second liquid repellent area 28b itself comprises scales, and therefore a glass plate with a low coefficient of thermal expansion is used as the material of the second liquid repellent area 28b. However, the present invention is not limited thereto; for example, a scale member that comprises a glass plate with a low coefficient of thermal expansion and wherein gratings are formed may be fixed to the upper surface of the wafer table WTB by, for example, a leaf spring (or by vacuum chucking) so that shrinkage and expansion does not occur locally; in such a case, the plate 28 may be substituted by a water repellent plate, the entire surface of which is coated with the same water repellent coat.

The −Y end surface and the −X end surface of the wafer table WTB are each mirror polished, thereby forming reflecting surfaces 17a, 17b, as shown in FIG. 2. The Y axis interferometer 16 and an X axis interferometer 126 (refer to FIG. 2) of the interferometer system 118 (refer to FIG. 7) project interferometer beams (length measuring beams) to the reflecting surfaces 17a, 17b, respectively, and receive the beams reflected thereby. Furthermore, the interferometers 16, 126 measure the displacements of the reflecting surfaces from reference positions (e.g., reference mirrors that are disposed on the side surfaces of the projection unit PU), i.e., the position of the wafer stage WST within the XY plane; furthermore, those measurement values are supplied to the main control apparatus 20. In the present embodiment, multiaxis interferometers, each of which has a plurality of optical axes, are used as the Y axis interferometer 16 and the X axis interferometer 126; furthermore, based on the measurement values of the interferometers 16, 126, the main control apparatus 20 can measure the position of the wafer table WTB in the X and Y directions and its rotation in the θx directions (pitching), its rotation in the θy directions (rolling), and its rotation in the θz directions (yawing).

However, in the present embodiment, the position (including the rotation in the θz directions) of the wafer stage WST (the wafer table WTB) within the XY plane is measured principally by the encoder system (discussed below) that includes, for example, the Y scales and the X scales, which were discussed above; furthermore, the measurement values of the interferometers 16, 126 are used supplementarily when, for example, long-term fluctuations (e.g., caused by scale deformation over the course of time) in the measurement values of the encoder system are corrected (calibrated). In addition, the Y axis interferometer 16 is used in the measurement of, for example, the position of the wafer table WTB in the Y directions in the vicinity of the unloading position (discussed below) and the loading position, which are the wafer exchange positions. In addition, at least one of the measurements of the interferometer system 118, i.e., at least one of the positions in the directions of five degrees of freedom (the X, the Y, the θx, the θy, and the θz directions), is used in the movement of the wafer stage WST, for example, between the loading operation and the alignment operation and/or between the exposure operation and the unloading operation.

Figure 3:
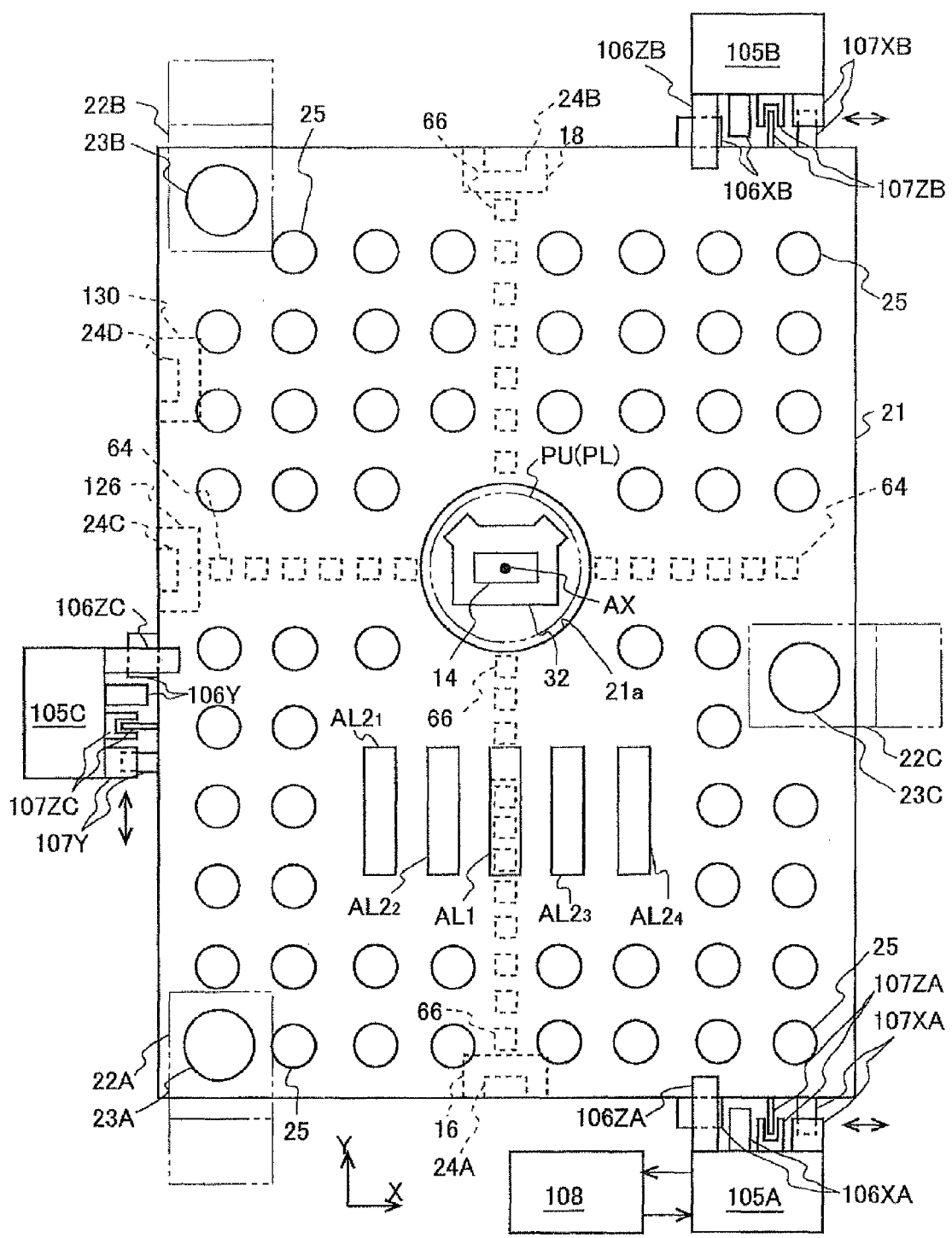
FIG. 3 is a cross sectional view that shows a measurement frame of FIG. 1.

Furthermore, as shown in FIG. 3, which is a plan view of the measurement frame 21 in FIG. 1, the Y axis interferometer 16 and the X axis interferometer 126 of the interferometer system 118 as well as the Y axis interferometer 18 and a X axis interferometer 130 for the measurement stage MST (discussed below) are supported by the bottom surface of the measurement frame 21 via support members 24A, 24C, 24B, 24D. Nevertheless, the Y axis interferometers 16, 18 and the X axis interferometers 126, 130 may be provided either integrally with the projection unit PU, which is supported so that it is suspended as discussed above, or to the main frame that holds the projection unit PU. In these cases, each of the interferometers 16, 18, 126, 130 may include just an interferometer optical system that splits and combines the length measuring beam that travel toward the stages and the reference beam that travel toward the reference mirrors; in addition, a receiver of each of the interferometers 16, 18, 126, 130 (photoelectric detector) that receives the interference light produced by the interference between the length measuring beam and the reference beam may be supported by a column (not shown).

Furthermore, in the present embodiment, the wafer stage WST includes the stage main body 91, which is capable of moving freely within the XY plane, and the wafer table WTB, which is mounted on the stage main body 91 and is capable of finely moving relative to the stage main body 91 in the Z, the θx, and the θy directions, but the present invention is not limited thereto; of course, a single stage that is capable of moving with six degrees of freedom may be used as the wafer stage WST. In addition, instead of the reflecting surfaces 17a, 17b, movable mirrors that comprise plane mirrors may be provided to the wafer table WTB. Furthermore, the positions at which the reference mirrors (fiducial surfaces) are disposed are not limited to the projection unit PU, and the position of the wafer stage WST does not necessarily have to be measured using reference mirrors.

In addition, in the present embodiment, the position of the wafer stage WST, which is measured by the interferometer system 118, is not used in, for example, the exposure operation and the alignment operation discussed below, but rather it is used principally in, for example, the calibration operation (i.e., calibration of the measurement values) performed by the encoder system; however, the measurement information from the interferometer system 118 (at least one of the positions in the directions of five degrees of freedom) may be used in, for example, the exposure operation and/or the alignment operation. In the present embodiment, the encoder system measures the position of the wafer stage WST in the directions of three degrees of freedom, i.e., the X axial, the Y axial, and the θz directions. Accordingly, of the measurement information from the interferometer system 118, the exposure operation or the like may use just the position in directions (e.g., the θx directions and/or the θy directions) that differ from the directions (the X, the Y, and the θz directions) in which the position of the wafer stage WST is measured by the encoder system, or the position in the directions that are the same as the directions measured by the encoder system (i.e., at least one of the X directions, the Y directions, and the θz directions) in addition to the position in the abovementioned different directions. In addition, the interferometer system 118 may be capable of measuring the position of the wafer stage WST in the Z directions. In this case, the position in the Z directions may be used in, for example, the exposure operation.

The measurement stage MST in FIG. 1 is configured so that the flat, plate shaped measurement table MTB is fixed to the stage main body 92. Various measuring members are provided to the measurement table MTB and the stage main body 92. As shown in, for example, FIG. 2 and FIG. 6A, an illumination intensity nonuniformity sensor 94, which has a pin hole shaped light receiving part, an aerial image measuring instrument 96, which measures an aerial image (projected image) of the pattern that is projected by the projection optical system PL, a wavefront aberration measuring instrument 98, and the like are used as the measuring members.

Furthermore, in the present embodiment, an immersion exposure is performed wherein the wafer W is exposed with the illumination light IL through the projection optical system PL and the liquid (water) Lq; correspondingly, with the abovementioned illumination intensity nonuniformity sensor 94 (and a luminous flux intensity monitor), the aerial image measuring instrument 96, and the wavefront aberration measuring instrument 98, which are used in the measurements wherein the illumination light IL is used, the illumination light IL is received through the projection optical system PL and water.

Figure 6A:
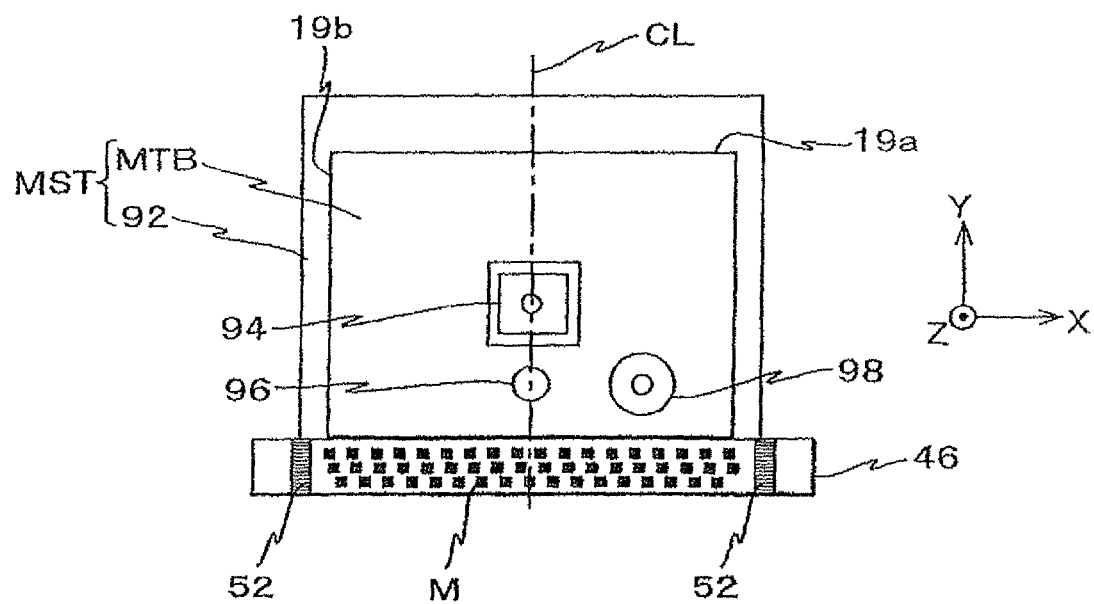
FIG. 6A is a plan view that shows a measurement stage.
Figure 6B:
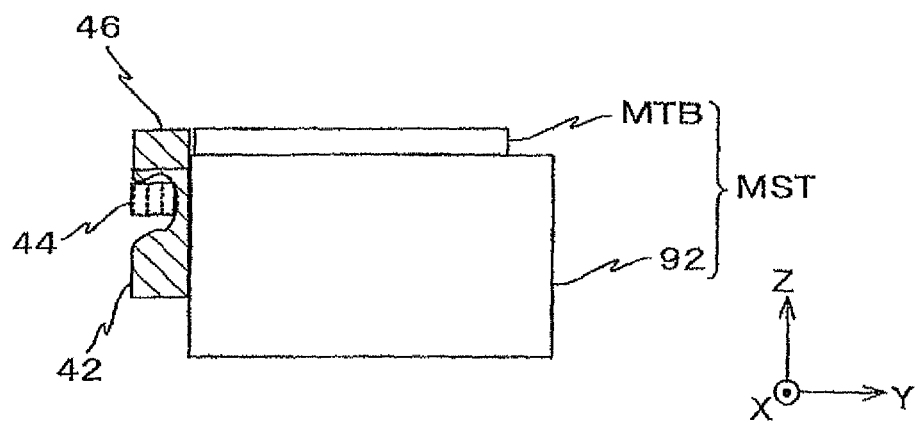
FIG. 6B is a partial, cross sectional side view of the measurement stage.

As shown in FIG. 6B, a frame shaped mounting member 42 is fixed to an end surface on the −Y direction side of the stage main body 92 of the measurement stage MST. In addition, two light receiving systems 44, which are disposed so that they can oppose the two light transmitting systems 36 discussed above, one of which is shown in FIG. 5B, are fixed to an end surface on the −Y direction side of the stage main body 92 in the vicinity of the center position inside the opening of the mounting member 42 in the X directions. Each of the light receiving systems 44 comprises: an optical system, such as a relay lens; a light receiving device, e.g., a photomultiplier tube; and a casing that houses these elements. As can be understood from FIG. 5B, FIG. 6B, and the explanation up to this point, in the present embodiment, the illumination light IL that transmits through each of the slit patterns SL of the measurement plate 30 is guided by the corresponding light transmitting system 36 (discussed above), and is received by the light receiving device of the corresponding light receiving system 44 in the state wherein the wafer stage WST and the measurement stage MST are proximate within a prescribed distance in the Y directions (or the state wherein they contact one another). Namely, the measurement plate 30, the light transmitting systems 36, and the light receiving systems 44 constitute an aerial image measuring apparatus 45 (refer to FIG. 7), which is similar to the one disclosed in, for example, Japanese Unexamined Patent Application Publication No. 2002-14005 (corresponding U.S. Patent Application Publication No. 2002/0041377).

A confidential bar (hereinbelow, abbreviated as "CD bar") 46, which serves as a fiducial member and comprises a rod shaped member that is rectangular in a cross section, is provided on the mounting member 42 in FIG. 6B so that it extends in the X directions. The CD bar 46 has a fully kinematic mount structure and is supported kinematically on the measurement stage MST.

The CD bar 46 is the standard (the measurement reference), and consequently a glass ceramic with a low coefficient of thermal expansion, e.g., Zerodur (the name of a product made by Schott Nippon K.K.), is used as the material of the CD bar 46. The upper surface (front surface) of the CD bar 46 is made with a high degree of flatness—on the same order as that of a so-called fiducial plane parallel plate. In addition, as shown in FIG. 6A, a reference grating (e.g., diffraction grating) 52 with a direction of periodicity in the Y directions is formed in the vicinity of the end part of the CD bar 46 on one side and on another side in the longitudinal directions. The two reference gratings 52 are formed so that they are spaced apart by a prescribed distance (L) at the center of the CD bar 46 in the X directions, i.e., symmetric with respect to a center line CL discussed above.

In addition, a plurality of fiducial marks M, which is disposed as shown in FIG. 6A, is formed in the upper surface of the CD bar 46. The multiple fiducial marks M are formed in an array of three rows in the Y directions with identical pitch; furthermore, the fiducial marks M are formed so that adjacent rows are shifted from one another in the X directions by a prescribed distance. A two-dimensional mark with dimensions that can be detected by a primary alignment system and secondary alignment systems (discussed below) is used for each of the fiducial marks M. The shape (configuration) of each of the fiducial marks M may be different than that of the fiducial mark FM in FIG. 5A discussed above; however, in the present embodiment, the fiducial marks M and the fiducial mark FM have identical configurations, and the alignment marks of the wafer W are likewise identically configured. Furthermore, in the present embodiment, the front surface of the CD bar 46 and the front surface of the measurement table MTB (which may include the measuring members discussed above) are each covered by a liquid repellent film (water repellent film).

As shown in FIG. 2, reflecting surfaces 19a, 19b are formed on the +Y end surface and the -X end surface, respectively, of the measurement table MTB, the same as with the wafer table WTB discussed above. The Y axis interferometer 18 and the X axis interferometer 130 of the interferometer system 118 (refer to FIG. 7) measure the displacement of each of the reflecting surfaces from a corresponding reference position information, i.e., the position of the measurement stage MST (including, for example, at least the position informations in the X and the Y directions and the rotation information in the θz directions), by projecting interferometer beams (length measuring beams) to the reflecting surfaces 19a, 19b and receiving the beams reflected thereby, and supply these measurement values to the main control apparatus 20.

Incidentally, as shown in FIG. 2, stopper mechanisms 48A, 48B are provided to both end parts of the X axis stators 81, 80 in the X directions. The stopper mechanisms 48A, 48B comprise: shock absorbers 47A, 47B, which are provided to the X axis stator 81 and serve as cushioning apparatuses that comprise, for example, oil dampers; openings 51A, 51B, which are provided to the X axis stator 80 at positions that oppose the shock absorbers 47A, 47B; and shutters 49A, 49B that open and close the openings 51A, 51B. The open/close states of the openings 51A, 51B, which are opened and closed by the shutters 49A, 49B, are detected by open/close sensors 101 (refer to FIG. 7), which are provided in the vicinities of the shutters 49A, 49B; in addition, the detection results are sent to the main control apparatus 20.

The operation of the stopper mechanisms 48A, 48B will now be explained, taking the stopper mechanism 48A as a representative example.

In FIG. 2, if the X axis stator 81 and the X axis stator 80 approach one another in the state wherein the shutter 49A covers the opening 51A, then the shock absorber 47A and the shutter 49A contact one another, and thereby the X axis stators 80, 81 cannot approach one another any further. However, if the X axis stators 81, 80 approach one another in the state wherein the shutter 49A is open and in turn the opening 51A is open, then at least part of a tip part of the shock absorber 47A can be inserted into the opening 51A, and thereby the X axis stators 81, 80 can be made to approach one another. As a result, it is possible to make the wafer table WTB and the measurement table MTB (the CD bar 46) contact one another (or to draw near so that they are within a distance of approximately 300 μm).

In FIG. 2, spacing sensors 43A, 43C and collision sensors 43B, 43D are provided on both end parts of the X axis stator 80 on the -Y side, and plate shaped members 41A, 41B, each of which is long and thin in the Y directions, are provided to opposite end parts of the X axis stator 81 on the +Y side so that they project therefrom. The spacing sensors 43A, 43C comprise, for example, light transmissive photosensors (e.g., sensors that consist of LED phototransistors); in addition, when the X axis stator 80 and the X axis stator 81 approach one another, the plate shaped member 41A enters the spacing sensor 43A, which reduces the amount of light received and makes it possible to detect the fact that the spacing between the X axis stators 80, 81 has fallen below the prescribed distance.

Similar to the spacing sensors 43A, 43C, the collision sensors 43B, 43D are photoelectric sensors and are disposed on the far side thereof. With the collision sensors 43B, 43D, at the point that the X axis stators 81, 80 further approach one another and the wafer table WTB and the CD bar 46 (the measurement table MTB) are in contact (or at a point at which they approach one another within a distance of approximately 300 μm), the upper half of the plate shaped member 41A is positioned between the sensors, and consequently the main control apparatus 20 can detect the fact that the tables are in contact (or have approached one another within a distance of approximately 300 μm) by detecting the fact that the amount of light received by those sensors is zero.

Figure 4:
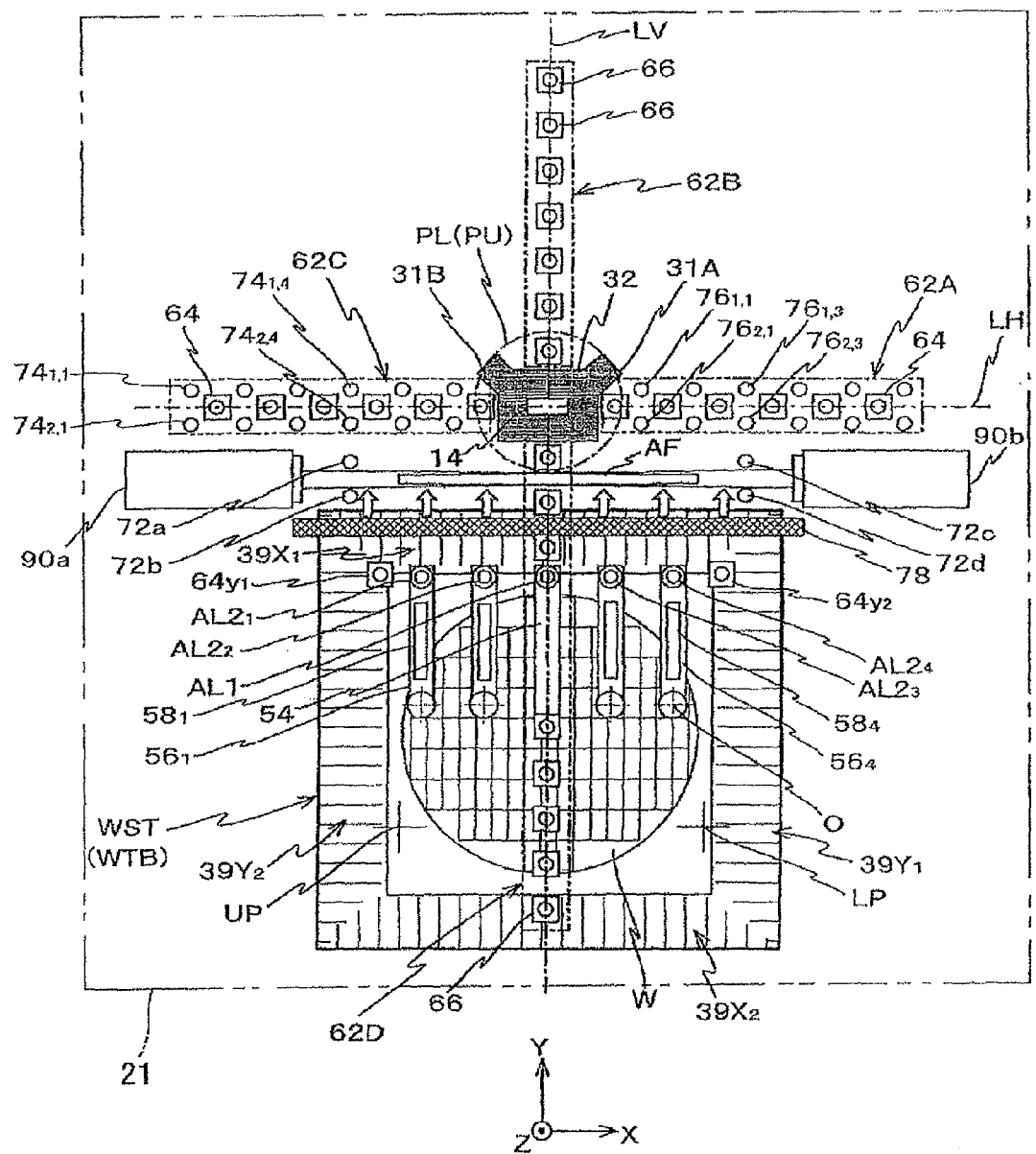
FIG. 4 is a view that shows the layout of alignment systems and position measurement encoders in FIG. 1.

Although not shown in FIG. 1 in order to avoid complicating the drawing, with the exposure apparatus 100 in the present embodiment, a primary alignment system AL1 is actually disposed as shown in FIG. 4; here, the primary alignment system AL1 has a center of detection that is along a straight line LV, which is parallel to the Y axis and passes through the center of the projection unit PU (i.e., the optical axis AX of the projection optical system PL; in the present embodiment, the projection unit PU also coincides with the center of the exposure area IA discussed above), and that is at a position that is spaced apart from the optical axis AX on the −Y side by a prescribed distance. The primary alignment system AL1 is fixed to the measurement frame 21 (refer to FIG. 1) via a support member 54. Secondary alignment systems $AL2_1$, $AL2_2$ and secondary alignment systems $AL2_3$, $AL2_4$ are provided on one side and another side, respectively, of the primary alignment system AL1 in the X directions so that the primary alignment system AL1 is interposed therebetween; furthermore, the detection centers of the secondary alignment systems $AL2_1$, $AL2_2$ and the secondary alignment systems $AL2_3$, $AL2_4$ are disposed substantially symmetrically with respect to the straight line LV. Namely, the detection centers of the five alignment systems AL1, $AL2_1$-$AL2_4$ are disposed at different positions in the X directions, i.e., they are disposed along the X directions.

As shown representatively for the secondary alignment system $AL2_4$, each of the secondary alignment systems $AL2_n$ (n=1-4) is fixed to a tip (pivoting end) of a corresponding arm $56_n$ (n=1-4), which is capable of pivoting around a center of rotation O clockwise and counterclockwise in FIG. 4 within a prescribed angular range. In the present embodiment, part of each of the secondary alignment systems $AL2_n$ (for example, including at least the optical system that radiates alignment light to a detection area and that guides light emitted from a target mark within the detection area to the light receiving device) is fixed to the corresponding arm $56_n$, and the remaining part is provided to the measurement frame 21. Each of the secondary alignment systems $AL2_1$-$AL2_4$ is pivoted around the center of rotation O and its X position is thereby adjusted. Namely, the detection areas (and the detection centers) of the secondary alignment systems $AL2_1$-$AL2_4$ are independently moveable in the X directions. Furthermore, in the present embodiment, the X position of each of the secondary alignment systems $AL2_1$-$AL2_4$ is adjusted by the pivoting of the corresponding arm, but the present invention is not limited thereto; for example, a drive mechanism may be provided that drives the secondary alignment systems $AL2_1$-$AL2_4$ reciprocatively in the X directions. In addition, at least one of the secondary alignment systems $AL2_1$-$AL2_4$ may be moveable not only in the X directions, but also in the Y directions. Furthermore, part of each of the secondary alignment systems $AL2_n$ is moved by the corresponding arm $56_n$, and therefore a sensor (not shown), e.g., an interferometer or an encoder, can measure the position of the part that is fixed to that corresponding arm $56_n$. The sensors may measure the position of the secondary alignment systems $AL2_n$ in the X directions only, but they may also be capable of measuring the positions of the secondary alignment systems $AL2_n$ in other directions, e.g., the Y directions and/or the rotational directions (including at least one of the θx and the θy directions).

Vacuum pads $58_n$ (n=1-4), each of which comprises a differential exhaust type air bearing, are provided to the upper surfaces of the arms $56_n$, respectively. In addition, rotary drive mechanisms $60_n$ (n=1-4; refer to FIG. 7), which include motors and the like, can pivot the arms $56_n$ in accordance with instructions from the main control apparatus 20. After the main control apparatus 20 rotationally adjusts the arms $56_n$, it operates the vacuum pads $58_n$ so as to chuck the arms $56_n$ to the measurement frame 21 (refer to FIG. 1). Thereby, the states of the arms $56_n$, after their rotational angles have been adjusted are maintained, i.e., the desired positional relationships among the primary alignment system AL1 and the four secondary alignment systems $AL2_1$-$AL2_4$ are maintained.

Magnetic bodies may be fixed in advance to the portions of the measurement frame 21 that oppose the arms $56_n$, and electromagnets may be used instead of the vacuum pads $58_n$.

In the present embodiment, for example, an image processing type field image alignment (FIA) system is used for the primary alignment system AL1, and each of the four secondary alignment systems $AL2_1$-$AL2_4$. Each FIA system irradiates a target mark with a broadband detection beam that does not photosensitize the resist on, for example, the wafer W, uses an image capturing device (e.g., a CCD or a CMOS) to capture an image of an index (an index pattern on an index plate that is provided in each alignment system; not shown) and an image of a target mark that is formed on a light receiving surface by the light reflected from that target mark, and outputs the captured image signals thereof. The captured image signal from each of the alignment systems $AL2_1$-$AL2_4$ is supplied to the main control apparatus 20 (FIG. 7).

Furthermore, each of the alignment systems mentioned above is not limited to an FIA system; for example, it is of course possible to use, either independently or in appropriate combination: an alignment sensor that radiates a coherent detection beam to a target mark and detects scattered light or diffracted light emitted from that target mark; and an alignment sensor that causes and detects interference between two diffracted lights (e.g., diffracted lights of the same order or diffracted lights that diffract in the same direction) emitted from that target mark. In addition, in the present embodiment, five alignment systems AL1, $AL2_1$-$AL2_4$ are provided, which makes it possible to perform alignment efficiently. Nevertheless, the number of alignment systems is not limited to five; for example, there may be two to four or more than six, and there may be an even or odd number. In addition, just the primary alignment system AL1 may be used. Furthermore, in the present embodiment, each of the five alignment systems AL1, $AL2_1$-$AL2_4$ is fixed to the measurement frame 21 via the corresponding support member 54, but the present invention is not limited thereto; for example, they may be fixed to a lower surface of the main frame that holds the projection unit PU.

As shown in FIG. 4, with the exposure apparatus 100 of the present embodiment, four head units 62A-62D of the encoder system are disposed in a state such that they surround the nozzle unit 32 discussed above on all four sides thereof. A plurality of Y heads 64 and X heads 66 that constitute the head units 62A-62D are fixed to the bottom surface of the flat, plate shaped measurement frame 21 (refer to FIG. 1) via fixed members (not shown), as shown by chain double-dashed lines in FIG. 4. The fixed members can comprise, for example: multiple bushings, each of which has a female thread formed therein that is made of a metal with a low coefficient of expansion (e.g., Invar), that are embedded in the measurement frame 21 and fixed therein by, for example, bonding; and bolts that fix the casing of each of the individual heads 64, 66 of the head units 62A-62D to the corresponding bushing.

FIG. 3 is a plan view that shows the measurement frame 21. As shown in FIG. 3, an opening 21a, through which the tip part of the projection unit PU passes, is formed in the center part of the measurement frame 21. The measurement frame 21 is formed from a material that has an extremely low coefficient of linear thermal expansion (low coefficient of expansion). Furthermore, the head units 62A-62D may be fixed in the state wherein they are suspended from a member with an extremely low coefficient of linear thermal expansion that is fixed to the main frame that holds the projection unit PU (discussed above).

The material of the measurement frame 21 is, for example, a low expansion glass (e.g., CLEARCERAM-Z HS, which is the name of a product made by Ohara Inc.) or a low expansion glass ceramic (e.g., Zerodur, which is the name of a product made by Schott Nippon K.K.), both of which have a coefficient of linear thermal expansion that is within approximately $\pm 0.2 \times 10^{-7}$/K ($\pm 0.02$ ppm/K). In addition, a low expansion ceramic that has a coefficient of linear thermal expansion within approximately $0.5 \times 10^{-6}$/K (0.5 ppm/K), or Super Invar, which has a linear thermal expansion coefficient that is smaller than that of Invar, can also be used as the material of the measurement frame 21.

In this regard, the material of a main body part, whereon the plate 28 of the wafer table WTB of the wafer stage WST (FIG. 1) is mounted, and the material of the stage main body 91 of the wafer stage WST are, for example, iron (steel), which has a coefficient of linear thermal expansion of approximately $0.1 \times 10^{-4}$/K (10 ppm/K), or Invar, which has a coefficient of linear thermal expansion of approximately $1 \times 10^{-6}$/K (1 ppm/K). As a result, the coefficient of linear thermal expansion of the measurement frame 21 in the present embodiment is set smaller than, e.g., approximately ½-⅕₀, that of the members (the main body part of the wafer stage WST) excepting the plate 28 (FIG. 5A) wherein the scales $39Y_1$, $39Y_2$, $39X_1$, $39X_2$ of the wafer stage WST are formed.

Furthermore, as shown in FIG. 1, the exposure apparatus 100 of the present embodiment is disposed on a floor FL inside a chamber (not shown). The base plate 12, which guides the wafer stage WST, is disposed on the floor FL via, for example, a plurality of vibration isolating blocks (not shown). Furthermore, three L-shaped suspending members 22A, 22B, 22C (refer to FIG. 3) are fixed on the floor FL so that they surround the base plate 12, and the measurement frame 21 is supported so that it is suspended from the tip parts of the suspending members 22A, 22B, 22C via vibration isolating members 23A, 23B, 23C, respectively. The vibration isolating members 23A-23C are members that isolate vibrations using, for example, air springs, hydraulics, or mechanical springs.

In FIG. 3, columns 105A, 105B, 105C are installed on the floor surface at three locations: positions that sandwich the measurement frame 21 in the Y directions; and a position along the side surface of the measurement frame 21 in the −X direction. X axis sensors 106XA, 106XB, which measure the displacement of the measurement frame 21 in the X directions, and Z axis sensors 106ZA, 106ZB, which measure the displacement of the measurement frame 21 in the Z directions, are mounted between the columns 105A, 105B and the measurement frame 21. In addition, a Y axis sensor 106Y, which measures the displacement of the measurement frame 21 in the Y directions, and a Z axis sensor 106ZC, which measures the displacement of the measurement frame 21 in the Z directions, are mounted between the column 105C and the measurement frame 21. An interferometer, an electrostatic capacitance type displacement sensor, an eddy current type displacement sensor, or the like can be used for each of the six axial sensors 106XA-106ZC. The six axial sensors 106XA-106ZC measure the displacement of the measurement frame 21, the floor surface of which serves as a reference, in six degrees of freedom, i.e., in the X, the Y, the Z, the θx, the θy, and the θz directions, with high precision and at a prescribed sampling rate; furthermore, the measurement values are supplied to a control unit 108.

In addition, X axis actuators 107XA, 107XB, which displace the measurement frame 21 in the X directions, are mounted between the columns 105A, 105B and the measurement frame 21, respectively; in addition, Z axis actuators 107ZA, 107ZB, which displace the measurement frame 21 in the Z directions, are mounted between the columns 105A, 105B and the measurement frame 21, respectively. Furthermore, a Y axis actuator 107Y, which displaces the measurement frame 21 in the Y directions, and a Z axis actuator 107ZC, which displaces the measurement frame 21 in the Z directions, are mounted between the column 105C and the measurement frame 21. For example, a voice coil motor can be used for each of the six axial noncontactual type actuators 107XA, 107XB, 107Y, 107ZA-107ZC, but it is otherwise also possible to use, for example, EI core type electromagnetic actuators. The six axial actuators 107XA-107ZC can control the displacement of the measurement frame 21 with respect to the floor surface with six degrees of freedom. Under the control of the main control apparatus 20 (FIG. 7), the control unit 108 uses a servo system to drive the six axial actuators 107XA-107ZC based on the measurement values of the six axial sensors 106XA-106ZC during the performance of a scanning exposure so that the displacement of the measurement frame 21 with respect to the floor surface in six degrees of freedom falls within a prescribed permissible range. Furthermore, the main frame (not shown) that holds the projection unit PU may be used as the reference for measuring and controlling the displacement of the measurement frame 21.

Referring to FIG. 1, when the exposure apparatus 100 is operated, highly purified, temperature stabilized gas (e.g., dry air) is supplied in a downflow at a prescribed flow rate via ventilation ports 6A, 6B in the ceiling of the chamber (not shown) wherein the exposure apparatus 100 is housed, as indicated by arrows 7A, 7B. Part of the supplied gas is recovered via a recovery port (not shown), which is provided in the floor FL, after which the gas passes through a dust filter and a temperature control unit, and then once again returns to the interior of the chamber via the ventilation ports 6A, 6B. At this time, numerous openings 25 are formed with a prescribed pitch in the X directions and the Y directions over substantially the entire surface of the area that surrounds the projection unit PU of the measurement frame 21, as shown in FIG. 3, so that the gas flows smoothly in a downflow inside the chamber. Thereby, the temperature stability and the like of the wafer W on the wafer stage WST is improved.

Next, referring to FIG. 4, the head units 62A, 62C comprise a plurality of Y heads 64 (here, six for each head unit) that are disposed on the +X side and the −X side of the projection unit PU in the X directions at prescribed intervals along a straight line LH that passes through the optical axis AX of the projection optical system PL and is parallel to the X axis. The Y heads 64 measure the position (the Y position) of the wafer stage WST (the wafer table WTB) in the Y directions using the Y scales $39Y_1$, $39Y_2$ (FIG. 5A) discussed above. In addition, the head units 62B, 62D comprise a plurality of X heads 66 (here, seven and eleven; however, in FIG. 4, three of the eleven are overlapped by the primary alignment system AL1 and are therefore not shown) that are disposed on the +Y side and the −Y side of the projection unit PU in the Y directions substantially at prescribed intervals along the straight line LV that passes through the optical axis AX and is parallel to the Y axis. The X heads 66 measure the position (X position) of the wafer stage WST (the wafer table WTB) in the X directions using the X scales $39X_1$, $39X_2$ (FIG. 5A) discussed above.

Accordingly, the head units 62A, 62C in FIG. 4 comprise multilens (here, six-lens) Y axis linear encoders (hereinbelow, properly abbreviated as "Y encoders") 70A, 70C (refer to FIG. 7) that measure the Y position of the wafer stage WST (the wafer table WTB) using the Y scales $39Y_1$, $39Y_2$ (FIG. 5A). The Y encoders 70A, 70C comprise switching control units 70Aa, 70Ca that switch among the measurement values of the plurality of Y heads 64 (discussed in detail later). Here, the spacing between adjacent Y heads 64 (i.e., between the measurement beams radiated from the Y heads 64) that constitute the head units 62A, 62C is set narrower than the widths (more precisely, the lengths of the grating lines 38) of the Y scales $39Y_1$, $39Y_2$ (discussed above) in the X directions. In addition, the Y heads 64 and the X heads 66—of the pluralities of Y heads 64 and X heads 66 that constitute the head units 62A-62D—that are positioned most on the inner side are disposed as close as possible to the optical axis AX, and are therefore fixed to the measurement frame 21 at the lower end part of the lens barrel 40 of the projection optical system PL (more precisely, the lateral sides of the nozzle unit 32 that surrounds the objective 191).

In addition, the head units 62B, 62D basically comprise multilens (here, seven and eleven lenses, respectively) X axis linear encoders (hereinbelow, properly abbreviated as "X encoders") 70B, 70D (refer to FIG. 7) that measure the X position of the wafer stage WST (the wafer table WTB) using the X scales $39X_1$, $39X_2$ discussed above. The X encoders 70B, 70D comprise switching control units 70Ba, 70Da that switch among the measurement values of the plurality of X heads 66 (discussed in detail later). Furthermore, in the present embodiment, there is a case wherein two of the eleven X heads 66 that constitute the head unit 62D simultaneously oppose the X scales $39X_1$, $39X_2$ when, for example, alignment is performed (discussed below). In such a case, the X scales $39X_1$, $39X_2$ and the opposing X heads 66 constitute the X linear encoders 70B, 70D.

The spacing between adjacent X heads 66 (measurement beams) that constitute the head units 62B, 62D is set narrower than the widths (more precisely, the lengths of the grating lines 37) of the X scales $39X_1$, $39X_2$ in the Y directions (discussed above).

Furthermore, Y heads $64y_1$, $64y_2$, wherein detection points are disposed so that they are substantially symmetric with respect to the detection centers, are provided on the −X side of the secondary alignment system $AL2_1$ and the +X side of the secondary alignment system $AL2_4$, respectively, (FIG. 4) along a straight line that is parallel to the X axis through which the detection center of the primary alignment system AL1 passes. The spacing between the Y heads $64y_1$, $64y_2$ is set so that it is substantially equal to a distance L (the spacing of the reference gratings 52 (FIG. 6(A) in the Y directions). The heads $64y_1$, $64y_2$ are configured so that they oppose the Y scales $39Y_2$, $39Y_1$, respectively, in the state wherein the center of the wafer W on the wafer stage WST is on the straight line LV, as shown in FIG. 4. When, for example, the alignment operation discussed below is performed, the Y scales $39Y_2$, $39Y_1$ are disposed opposing the Y heads $64y_1$, $64y_2$, respectively, and the Y heads $64y_1$, $64y_2$ (i.e., the Y encoders 70C, 70A, including the Y heads $64y_1$, $64y_2$) measure the Y position (and the angle in the θz directions) of the wafer stage WST.

In addition, in the present embodiment, the pair of reference gratings 52 of the CD bar 46 (FIG. 6A) and the Y heads $64y_1$, $64y_2$ oppose one another when, for example, the secondary alignment systems perform baseline measurement (discussed below); furthermore, the reference gratings 52, which oppose the Y heads $64y_1$, $64y_2$, measure the Y position of the CD bar 46 at the positions of the reference gratings 52. Hereinbelow, the linear encoders that comprise the Y heads $64y_1$, $64y_2$, which oppose the reference gratings 52, are called Y encoders 70E, 70F (refer to FIG. 7).

The measurement values of the six encoders 70A-70F discussed above are supplied to the main control apparatus 20, which controls the position of the wafer table WTB within the XY plane based on the measurement values of the encoders 70A-70D and controls the rotation of the CD bar 46 in the θz directions based on the measurement values of the Y encoders 70E, 70F.

The exposure apparatus 100 of the present embodiment is provided with an oblique incidence type multipoint focal point position detection system (hereinbelow, abbreviated as the "multipoint AF system") that comprises a radiating system 90a and a light receiving system 90b as shown in FIG. 4 and is configured the same as that disclosed in, for example, Japanese Unexamined Patent Application Publication No. H06-283403 (corresponding U.S. Pat. No. 5,448,332). In one example of the present embodiment, the radiating system 90a is disposed on the −Y side of the −X end part of the head unit 62C discussed above, and the light receiving system 90b is disposed on the −Y side of the +X end part of the head unit 62A discussed above in the state wherein it is opposed to the radiating system 90a.

The multiple detection points of the multipoint AF system (90a, 90b) in FIG. 4 are disposed on a surface to be inspected at prescribed intervals in the X directions. In the present embodiment, the detection points are disposed in a row matrix of, for example, 1 row by M columns (wherein M is the total number of detection points) or a matrix of 2 rows by N columns (wherein N is one half of the total number of detection points). In FIG. 4, the multiple detection points, each of which is irradiated by a detection beam, are not individually shown, but are rather shown as a long and thin detection area AF that extends in the X directions and is disposed between the radiating system 90a and the light receiving system 90b. The detection area AF is defined so that its length in the X directions is on the same order as the diameter of the wafer W, which makes it possible to measure the position (surface position) of substantially the entire surface of the wafer W in the Z directions with just a single scan of the wafer W in the Y directions. In addition, because the detection area AF is disposed between the immersion area 14 (the exposure area IA) discussed above and the detection areas of the alignment systems (AL1, $AL2_1$-$AL2_4$) with respect to the Y directions, it is possible to perform the detection operations in parallel by using the multipoint AF system and the alignment systems. The multipoint AF system may be provided to, for example, the main frame that holds the projection unit PU; however, in the present embodiment, it is provided to the measurement frame discussed above.

Furthermore, the multiple detection points are arranged in a matrix of 1 row by M columns or 2 rows by N columns, but the number of rows and/or the number of columns is not limited thereto. However, if the number of rows is two or greater, then it is preferable to offset the positions of the detection points in the X directions for the different rows. Furthermore, the multiple detection points are disposed in the X directions, but the present invention is not limited thereto; for example, all or part of the multiple detection points may be disposed at different positions in the Y directions.

The exposure apparatus 100 of the present embodiment is provided with two pairs of surface position sensors 72a, 72b and 72c, 72d for Z positional measurement (hereinbelow, abbreviated as "Z sensors") that are disposed symmetrically with respect to the straight line LV discussed above and are provided in the vicinity of the detection points of the plurality of detection points of the multipoint AF systems (90a, 90b)

that are positioned on both ends thereof, i.e., in the vicinities of both end parts of the detection area AF. The Z sensors 72a-72d are fixed to, for example, the lower surface of the measurement frame 21 in FIG. 3. Examples of sensors that can be used for each of the Z sensors 72a-72d include: a sensor that radiates light to the wafer table WTB from above, receives the light reflected thereby, and measures the position of the front surface of the wafer table WTB in the Z directions, which are orthogonal to the XY plane, at the irradiation point of that light; and an optical displacement sensor (CD pickup type sensor) that is configured as an optical pickup that is used in, for example, a CD drive apparatus. Furthermore, the Z sensors 72a-72d may be provided to, for example, the main frame of the projection unit PU discussed above.

Furthermore, the head unit 62C discussed above comprises multiple (here, six on each side with a total of twelve) Z sensors $74_{i,j}$ (i=1, 2 and j=1, 2, ..., 6) that are positioned on one side and another side of the straight line LH, which connects the multiple Y heads 64, so that the straight line LH is interposed therebetween in the X directions, and are disposed at prescribed intervals along two straight lines that are parallel to the straight line LH. In this case, the Z sensors $74_{1,j}$, $74_{2,j}$ that form pairs are disposed so that they are symmetric with respect to the abovementioned straight line LH. Furthermore, multiple pairs (here, six pairs) of the Z sensors $74_{1,j}$, $74_{2,j}$ and the multiple Y heads 64 are disposed alternately in the X directions. Similar to the Z sensors 72a-72d discussed above, sensors that are used for each of the Z sensors $74_{i,j}$ include, for example, CD pickup type sensors.

Here, the spacing between each pair of the Z sensors $74_{1,j}$, $74_{2,j}$, which is positioned so that the corresponding sensors are symmetric with respect to the straight line LH, is set so that it is equal to the spacing of the Z sensors 72c, 72d. In addition, the pair of Z sensors $74_{1,4}$, $74_{2,4}$ is positioned along a straight line that is parallel to the Y directions and is the same line along which the Z sensors 72a, 72b are positioned.

In addition, the head unit 62A discussed above comprises multiple (here, twelve) Z sensors $76_{p,q}$ (p=1, 2 and q=1, 2, ..., 6), which are disposed symmetrically to the multiple Z sensors $74_{i,j}$ discussed above with respect to the straight line LV discussed above. Similar to the Z sensors 72a-72d discussed above, sensors that are used for the Z sensors $76_{p,q}$ include, for example, CD pickup type sensors. In addition, the pair of Z sensors $76_{1,3}$, $76_{2,3}$ is positioned along a straight line in the Y directions that is the same line along which the Z sensors 72c, 72d are positioned. The Z sensors $74_{i,j}$ and $76_{p,q}$ are fixed to the bottom surface of the measurement frame 21.

Furthermore, in FIG. 4, the measurement stage MST is not shown and the immersion area 14, which is formed from the water Lq that is held between the measurement stage MST and the objective 191, is shown. In addition, in FIG. 4, a symbol 78 indicates a local air conditioning system that ventilates dry air, the temperature of which has been adjusted to a prescribed temperature, to the vicinity of the beam path of the multipoint AF system (90a, 90b) in, for example a downflow as shown by the outline arrows in FIG. 4. In addition, a symbol UP indicates an unload position at which the wafer on the wafer table WTB is unloaded, and a symbol LP indicates a load position at which the wafer on the wafer table WTB is loaded. In the present embodiment, the unload position UP and the loading position LP are set so that they are symmetric with respect to the straight line LV. Furthermore, the unload position UP and the loading position LP may be one and the same position.

FIG. 7 shows the principal components of the control system of the exposure apparatus 100. This control system principally comprises the main control apparatus 20, which comprises a microcomputer (or a workstation) that performs supervisory control of the entire apparatus. Furthermore, in FIG. 7, the various sensors that are provided to the measurement stage MST—e.g., the illumination intensity nonuniformity sensor 94, the aerial image measuring instrument 96, and the wavefront aberration measuring instrument 98, which are discussed above—are indicated collectively as a sensor group 9.

Figure 8A:
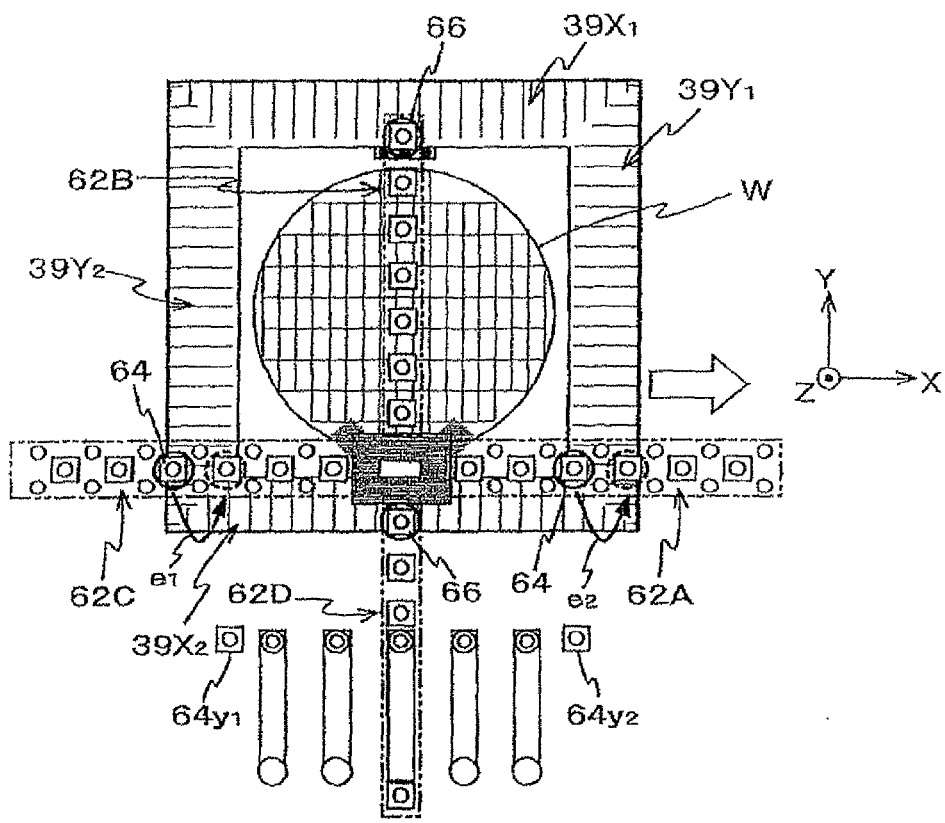
FIG. 8A is a view for explaining the measurement of the position of a wafer table within the XY plane, which is performed by the plurality of encoders each of which comprises a plurality of heads arranged in an array, and the handover of measurement values between heads.
Figure 8B:
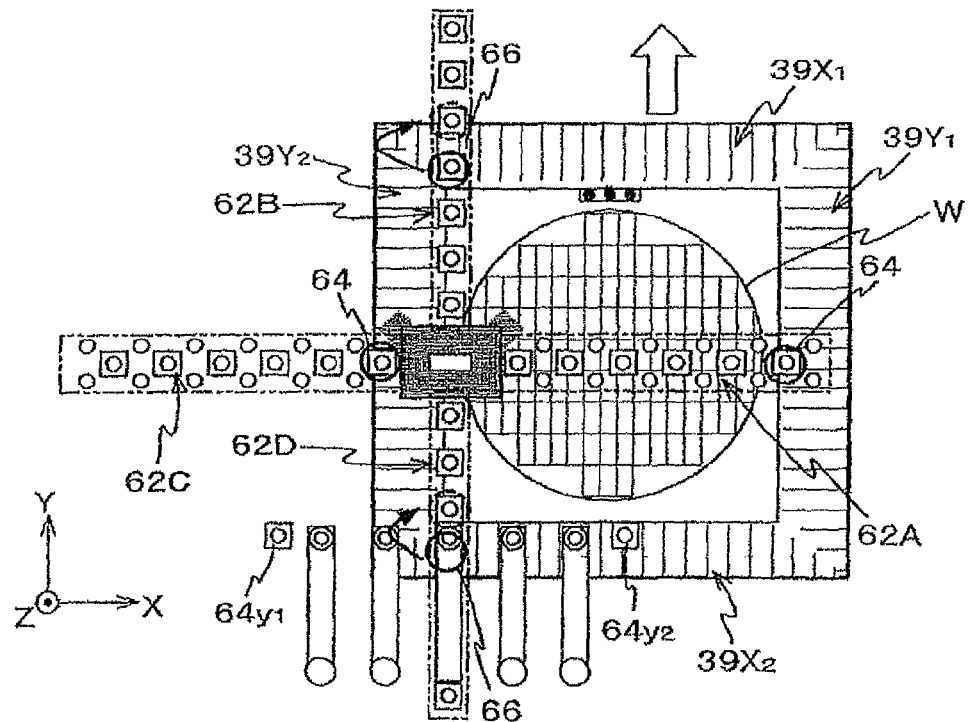
FIG. 8B is a view for explaining the measurement of the position of a wafer table within the XY plane, which is performed by the plurality of encoders each of which comprises a plurality of heads arranged in an array, and the handover of measurement values between heads.

The exposure apparatus 100 of the present embodiment, which is configured as discussed above, adopts the arrangement of the X scales and the Y scales on the wafer table WTB as discussed above and the arrangement of the X heads and the Y heads as discussed above, and therefore—within the effective stroke range of the wafer stage WST (i.e., in the present embodiment, the range of movement needed to perform alignment and the exposure operation)—the X scales $39X_1$, $39X_2$ and the head units 62B, 62D (the X heads 66) necessarily oppose one another, and the Y scales $39Y_1$, $39Y_2$ and the head units 62A, 62C (the Y heads 64) or the Y heads $64y_1$, $64y_2$ necessarily oppose one another, as exemplified in FIG. 8A, FIG. 8B, and the like. Furthermore, in FIG. 8A and FIG. 8B, the heads that oppose the corresponding X scales and Y scales are enclosed by circles.

Consequently, the main control apparatus 20 can control the position (including the rotation in the θz directions) of the wafer stage WST—within the effective stroke range of the wafer stage WST discussed above—in the XY plane with high precision by controlling each of the motors that constitute the stage drive system 124 based on at least three measurement values of the encoders 70A-70D. Because the effects of air turbulence on the measurement values of the encoders 70A-70D are smaller than on the interferometers to the extent that such effects can be ignored, the short-term stability of the measurement values, which is affected by air turbulence, is remarkably better than that of the interferometers. Furthermore, in the present embodiment, the sizes (e.g., the number of heads and/or the spacing) of the head units 62B, 62D, 62A, 62C are set in accordance with, for example, the effective stroke range of the wafer stage WST and the sizes of the scales (i.e., the range over which the diffraction gratings are formed). Accordingly, the four scales $39X_1$, $39X_2$, $39Y_1$, $39Y_2$ oppose all of the head units 62B, 62D, 62A, 62C within the effective stroke range of the wafer stage WST, but the four scales do not necessarily have to oppose all of the corresponding head units. For example, one of the X scales $39X_1$, $39X_2$ and/or one of the Y scales $39Y_1$, $39Y_2$ may shift from the head units. If one of the X scales $39X_1$, $39X_2$ or one of the Y scales $39Y_1$, $39Y_2$ shifts from the head units, then three scales oppose the head units within the effective stroke range of the wafer stage WST, and therefore it is possible to continuously measure the position of the wafer stage WST in the X axial, the Y axial, and the θz directions. In addition, if one of the X scales $39X_1$, $39X_2$ and one of the Y scales $39Y_1$, $39Y_2$ shifts from the head units, then the two scales oppose the head units within the effective stroke range of the wafer stage WST, and therefore the position of the wafer stage WST in the θz directions cannot be measured continuously, but the positions in the X and the Y directions can be measured continuously. In this case, the position of the wafer stage WST may be controlled by concomitantly using the position of the wafer stage WST in the θz directions measured by the interferometer system 118.

In addition, when the wafer stage WST is moved in the X directions as indicated by the outline arrow in FIG. 8A, each of the Y heads 64, which measure the position of the wafer stage WST in the Y directions, sequentially shifts to measurement of the adjacent Y head 64 as indicated by the arrows $e_1$, $e_2$ in the drawing. For example, the Y head 64 that is enclosed by the solid line circle shifts to measurement of the Y head 64 that is enclosed by the dotted line circle. Consequently, the switchover of the measurement values before and after the shift is performed by the switching control units 70Aa, 70Ca inside the Y encoders 70A, 70C (FIG. 7). Namely, in order to shift the Y heads 64 and switch over the measurement values smoothly in the present embodiment, the spacing between adjacent Y heads 64 that constitute the head units 62A, 62C is set narrower than the widths of the Y scales $39Y_1$, $39Y_2$ in the X directions, as discussed above.

In addition, in the present embodiment as discussed above, the spacing between adjacent X heads 66 that constitute the head units 62B, 62D is set narrower than the widths of the X scales $39X_1$, $39X_2$ (discussed above) in the Y directions. Accordingly, the same as discussed above, when the wafer stage WST is moved in the Y directions as indicated by the outline arrow in FIG. 8B, each of the X heads 66, which measure the position of the wafer stage WST in the X directions, sequentially shifts to measurement of the adjacent X head 66 (e.g., the X head 66 that is enclosed by the solid line circle shifts to measurement of the X head 66 that is enclosed by the dotted line circle), and the switchover of measurement values before and after that shift is performed by the switching control units 70Ba, 70Da inside the X encoders 70B, 70D (FIG. 7).

Figure 9A:
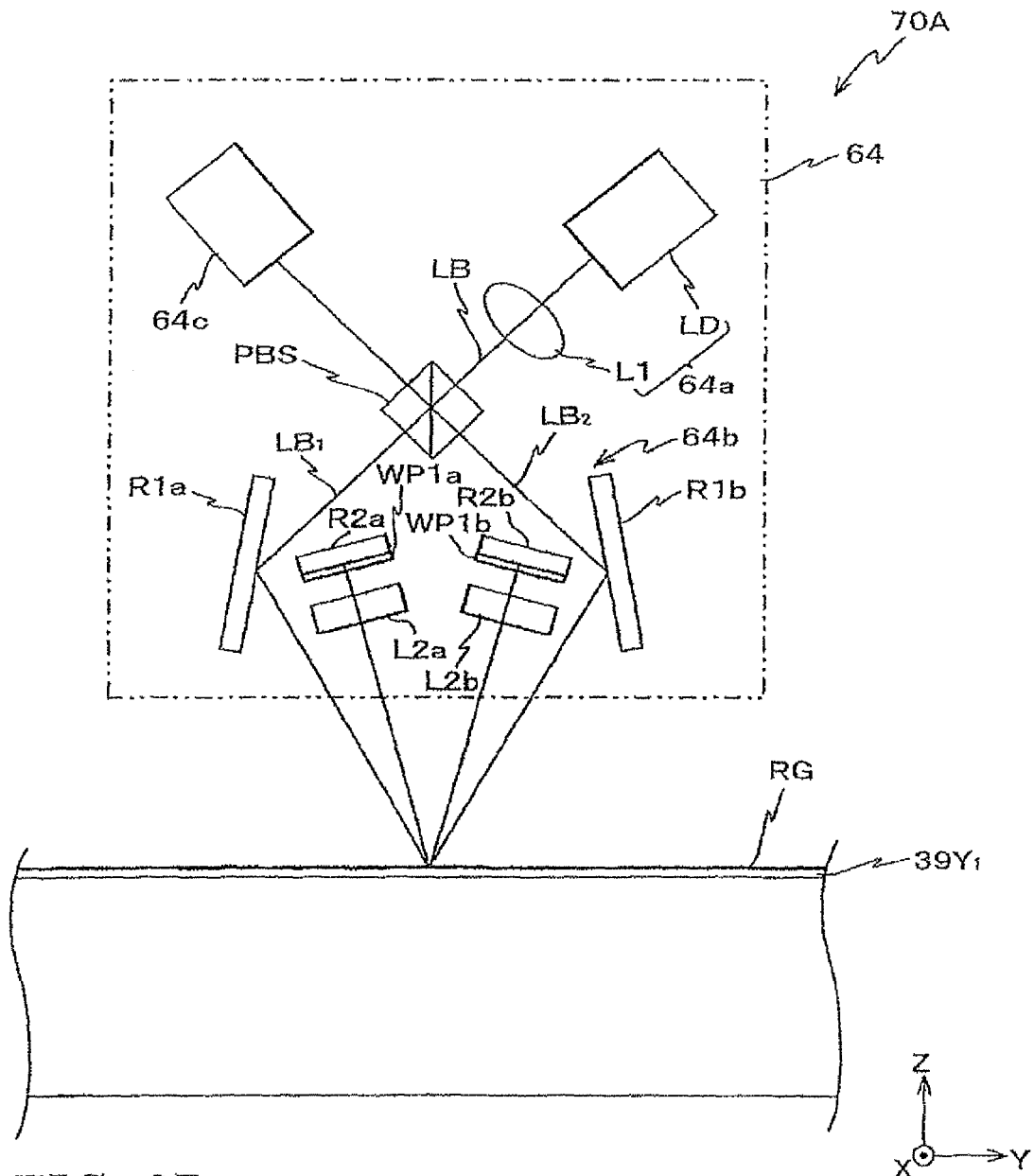
FIG. 9A shows one example of the configuration of an encoder.

Next, the configuration of the Y heads 64 and the X heads 66 of the encoders 70A-70F will be explained, taking the Y encoder 70A, an enlarged view of which is shown in FIG. 9A, as a representative example. FIG. 9A shows one of the Y heads 64 of the head unit 62A that radiates a detection beam (measurement beam) to the Y scale $39Y_1$.

The Y head 64 largely comprises three portions: a radiating system 64*a*; an optical system 64*b*; and a light receiving system 64*c*. The radiating system 64*a* includes: a light source, e.g., a semiconductor laser LD, that emits a laser beam LB in a direction that is at an angle of 45° with respect to the Y axis and the Z axis; and a lens L1, which is disposed in the optical path of the laser beam LB that is emitted from the semiconductor laser LD. The optical system 64*b* comprises: a polarizing beam splitter PBS, the separation plane of which is parallel to the XZ plane; quarter-wave plates (hereinbelow, denoted as "λ/4 plates") WP1*a*, WP1*b*; a pair of reflecting mirrors R1*a*, R1*b*; lenses L2*a*, L2*b*; and reflecting mirrors R2*a*, R2*b*.

The light receiving system 64*c* comprises a polarizer (an analyzer) and a photodetector. In the Y head 64 of the Y encoder 70A, the laser beam LB that is emitted from the semiconductor laser LD travels through the lens L1 and impinges the polarizing beam splitter PBS, upon which it is polarized and split into two beams $LB_1$, $LB_2$. The beam $LB_1$, which transmits through the polarizing beam splitter PBS, travels via the reflecting mirror R1*a* and reaches a reflecting diffraction grating RG that is formed in the Y scale $39Y_1$; furthermore, the beam $LB_2$ that is reflected by the polarizing beam splitter PBS travels via the reflecting mirror R1*b* and reaches the reflecting diffraction grating RG. Furthermore, polarization and splitting herein means the splitting of the incident beam into a P polarized light component and an S polarized light component.

Diffraction beams of a prescribed order (e.g., ±1st order diffraction beams), which are generated by the diffraction grating RG as a result of the radiation of the beams $LB_1$, $LB_2$, travel via the lenses L2*b*, L2*a*, are converted to circularly polarized beams by the λ/4 plates WP1*b*, WP1*a*, are reflected by the reflecting mirrors R2*b*, R2*a*, once again pass through the λ/4 plates WP1*b*, WP1*a*, and reach the polarizing beam splitter PBS by tracing the same optical path as the forward path, but in the reverse direction. Each of the two beams that reach the polarizing beam splitter PBS have a polarized light direction that is rotated by 90° with respect to the original direction. Consequently, the 1st order diffraction beam of the beam $LB_1$, which previously transmitted through the polarizing beam splitter PBS, is reflected by the polarizing beam splitter PBS and enters the light receiving system 64*c*; in addition, the 1st order diffraction beam of the beam $LB_2$, which was previously reflected by the polarizing beam splitter PBS, transmits through the polarizing beam splitter PBS, is combined coaxially with the −1st order diffraction beam of the beam $LB_1$, and enters the light receiving system 64*c*. Furthermore, inside the light receiving system 64*c*, the analyzers align the polarization directions of the abovementioned two ±1st order diffraction beams that interfere and thereby form interference light that is detected by the photodetectors, which then convert the intensity of the interference light to an electrical signal.

Furthermore, for example, an optical system that splits and combines the beams $LB_1$, $LB_2$ may be added to form a first interference light, a second interference light may be generated with a phase that differs by 90° from the first interference light, and the interference light thereof may be photoelectrically converted so as to generate an electrical signal. In this case, measurement resolving power can be increased by using a two phase electrical signal, wherein the phases differ by 90°, to generate measurement pulses that subdivide one-half the period (pitch) of the Y scale $39Y_1$ into, for example, at least 100 to 1000 parts.

Figure 9B:
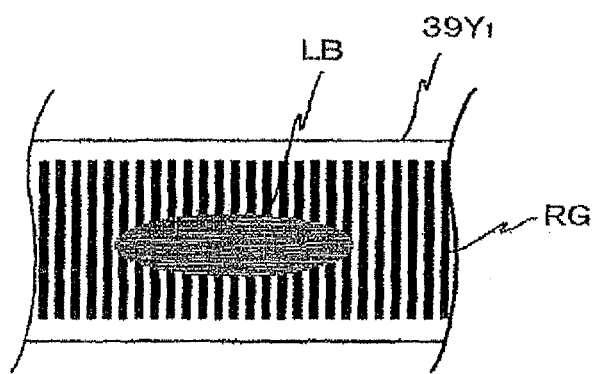
FIG. 9B shows the case wherein a laser beam, which has a cross sectional shape that extends longitudinally in the directions of periodicity of a grating, is used as a detection beam.

As can be understood from the explanation above, with the Y encoder 70A, the lengths of the optical paths of the two beams that are caused to interfere with one another are extremely short and substantially equal, and therefore it is possible to virtually ignore the effects of air turbulence. Furthermore, when the Y scale $39Y_1$ (i.e., the wafer stage WST) moves in either of the measurement directions (in this case, the Y directions), the phase of each of the beams changes, and the intensity of the interference light changes. The light receiving system 64*c* detects the change in the intensity of the interference light, and the positional information that corresponds to that intensity change is output as the measurement value of the Y encoder 70A. The other encoders 70B, 70C, 70D are configured similar to the Y encoder 70A. Each of the encoders has a resolving power of, for example, approximately 0.1 nm. Furthermore, with each of the encoders of the present embodiment, the laser beam LB, which has a cross sectional shape that extends lengthwise in the directions of periodicity of the grating RG may be used as the detection beam, as shown in FIG. 9B. FIG. 9B is a view wherein the size of the beam LB is exaggerated with respect to the grating RG.

Figure 11:
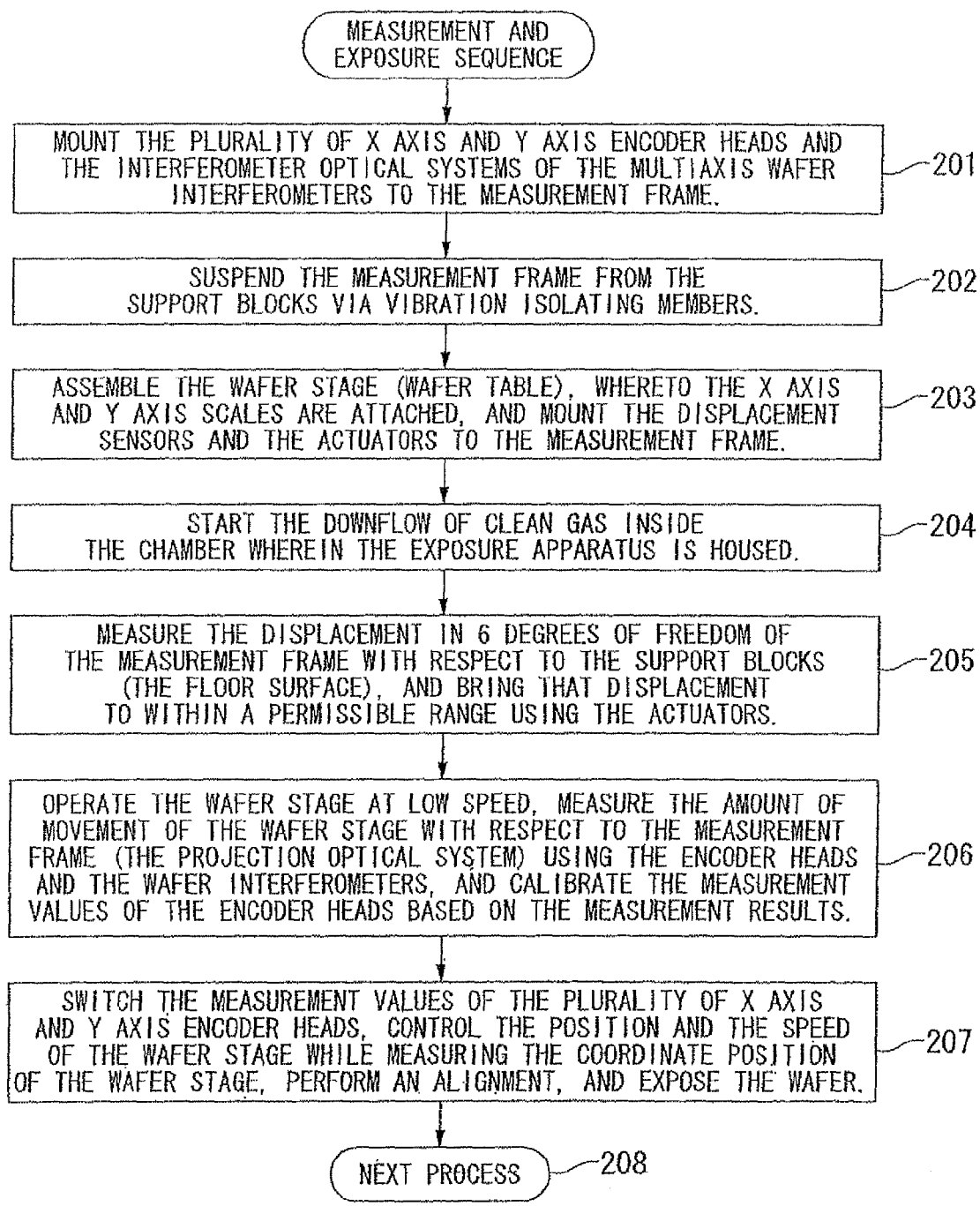
FIG. 11 is a flow chart that shows one example of the measurement and exposure operations according to a first embodiment.

The following explains one example of an operation wherein the position of the wafer stage WST in the exposure apparatus 100 of the present embodiment and is measured and an exposure is performed, referencing the flow chart in FIG. 11. First, in step 201 of FIG. 11, the plurality of the encoder heads (the X heads 66 and the Y heads 64) of the X axis and Y axis head units 62A-62D as well as the Y axis interferometers 16, 18 and the X axis interferometers 126, 130, which are optical systems of the multiaxis interferometers for wafer measurement, are mounted to the measurement frame 21 of FIG. 3. In step 202, which is the next step, the measurement frame 21 is suspended from the suspending members 22A-22C of FIG. 3 via the vibration isolating members 23A-23C. Subsequently, the tip part of the projection unit PU is passed through the opening 21*a* of the measurement frame 21, and the liquid immersion mechanism that includes the nozzle unit 32 is attached.

In step 203, which is the next step, the plate 28, wherein the X axis and Y axis scales $39X_1$, $39X_2$, $39Y_1$, $39Y_2$ of FIG. 5A are formed, is installed on the wafer table WTB, the wafer stage WST is assembled and adjusted, and the six axial sensors 106XA-106ZC (the displacement sensors) and the six axial actuators 107XA-107ZC shown in FIG. 3 are mounted to the measurement frame 21. The operations of the steps 201-203 up to this point are performed in a clean room when, for example, the exposure apparatus 100 is assembled and adjusted. After the assembly and adjustment are complete, the exposure apparatus 100 is housed inside a prescribed chamber.

Next, in step 204 of FIG. 11, when the operation of the exposure apparatus 100 is started, a downflow of clean gas is started inside the chamber, wherein the exposure apparatus is housed. In step 205, which is the next step, the sensors 106XA-106ZC of FIG. 3 measure the displacement of the measurement frame in six degrees of freedom with respect to the columns 105A-105C (the floor surface), and the actuators 107XA-107ZC are used to bring that displacement to within the permissible range. In step 206, which is the next step, the wafer stage WST is moved at low speed, the X heads 66 and the Y heads 64 (the encoder heads) as well as the Y axis interferometer 16 and the X axis interferometer 126 of the wafer interferometer measure the amount of movement of the wafer stage WST with respect to the measurement frame 21 (the projection optical system PL), and the measurement values of the X heads 66 and the Y heads 64 (the head units 62A-62D) are calibrated based on the measurement results. This calibration will now be explained in detail.

Namely, the scales of the encoders lack long-term mechanical stability because, for example, the diffraction gratings deform with the passage of usage time or as a result of thermal expansion and the like, and because the pitch of the diffraction grating varies partially or overall. Consequently, because the error included in each measurement value increases with the passage of usage time, it is necessary to compensate for it. In this case, the Y axis interferometer 16 and the X axis interferometer 126 of FIG. 2 can measure the Y position and the X position of the wafer table WTB without Abbé error.

Accordingly, using a speed that is low enough to ignore short-term fluctuations of the measurement values of the Y axis interferometer 16 caused by interferometer turbulence and while maintaining the measurement values of the X axis interferometer 126 at a prescribed value, the wafer stage WST is moved in the +Y direction (over the effective stroke range discussed above) while the amount of pitching, the amount of rolling, and the amount of yawing (which are determined based on the measurement values of the Y axis interferometer 16 and the Z sensors $74_{1,4}$, $74_{2,4}$, $76_{1,3}$, $76_{2,3}$ of FIG. 4) are maintained at zero, e.g., until the other ends (-Y side ends) of the Y scales $39Y_1$, $39Y_2$ coincide with the corresponding head units 62A, 62C. During this movement, the main control apparatus 20 captures the measurement values of the Y linear encoder 70A, 70C and the measurement values of the Y axis interferometer 16 (FIG. 7) at prescribed sampling intervals and derives the relationships between the measurement values of the Y linear encoders 70A, 70C and the measurement values of the Y axis interferometer 16 based on those captured measurement values. Based on these relationships, errors in the measurement values of the Y linear encoders 70A, 70C can be corrected.

Similarly, errors in the measurement values of the X linear encoders 70B, 70D (the head units 62B, 62D) can be corrected using the X axis interferometer 126.

Next, in step 207 of FIG. 11, the measurement values of the Y heads 64 and the X heads 66 (the encoder heads) of the plurality of X axis and Y axis head units 62A-62D are switched over, the position and the speed of the wafer stage WST are controlled while measuring the coordinates of the wafer stage WST, alignment is performed, and the wafer is exposed. Subsequently, in step 208, the reticle is exchanged, etc., and the operation of the next process is performed.

Specifically, the wafer alignment in step 207, which is performed by the exposure apparatus 100 of the present embodiment, will now be explained simply, referencing FIG. 10A through FIG. 10C.

Here, using the layout (shot map) shown in FIG. 10C, the operation will be explained for the case wherein a plurality of shot regions are formed on the wafer W, and sixteen colored shot regions AS thereof are assigned as the alignment shots.

Figure 10A:
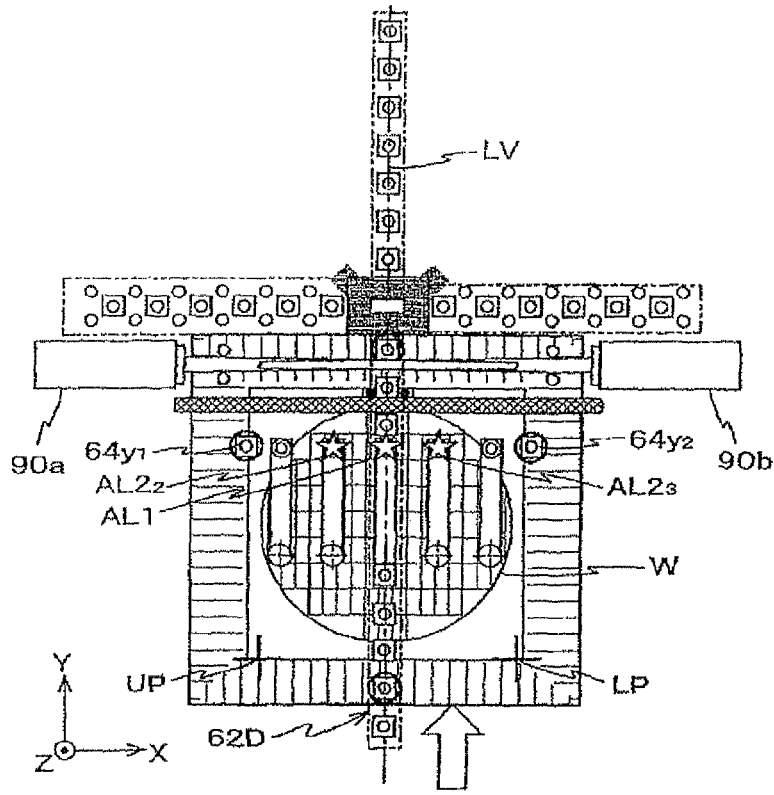
FIG. 10A shows the state in which a first alignment shot is measured.
Figure 10B:
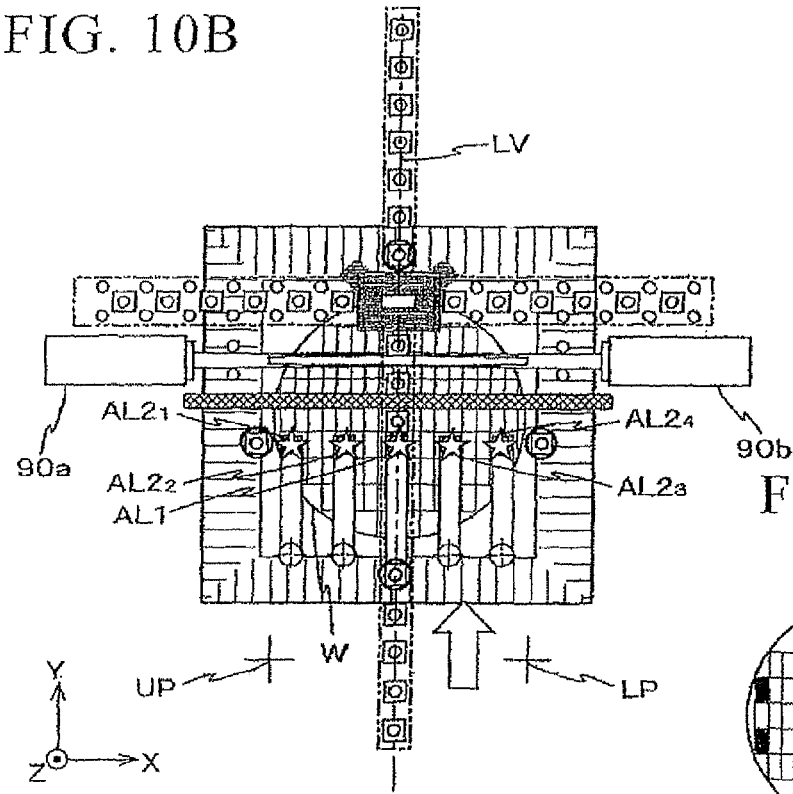
FIG. 10B shows the state wherein a second alignment shot is measured.
Figure 10C:
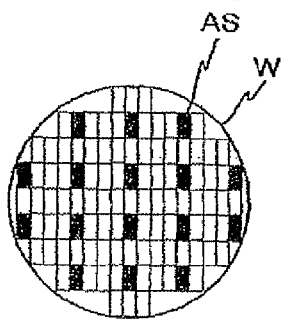
FIG. 10C shows one example of an array of alignment shots of a wafer.

Furthermore, the measurement stage MST is not shown in FIG. 10A and FIG. 10B.

At this time, for each of the alignment systems AL1, $AL2_1$-$AL2_4$ in FIG. 4, a baseline quantity (the positional relationship between the coordinates of the detection center and the reference position of the image of the pattern of the reticle R in FIG. 1) is derived in advance by using the relevant alignment system to measure the coordinates of the corresponding fiducial mark M on the CD bar 46 on the measurement stage MST side in FIG. 6A and is stored in the alignment calculation system 20a in FIG. 7. In addition, it is assumed that the secondary alignment systems $AL2_1$-$AL2_4$ perform positional adjustment in the X directions in advance in accordance with the layout of the alignment shots AS.

First, the main control apparatus 20 moves the wafer stage WST, whereon the center of the wafer W is positioned at the loading position LP, to the left and diagonally upward in FIG. 10A so that the wafer stage WST is positioned at a prescribed position (an alignment start position, which is discussed below) at which the center of the wafer W is positioned along the straight line LV. In this case, the main control apparatus 20 drives the various motors of the stage drive system 124 based on the measurement values of the X encoder 70D and the measurement values of the Y axis interferometer 16 in order to move the wafer stage WST. In this state wherein it is positioned at the alignment start position, the position (including the θz rotation) of the wafer table WTB, whereon the wafer W is mounted, within the XY plane is controlled based on the measurement values of the four encoders, i.e., the two X heads 66, which constitute the head unit 62D that opposes the X scales $39X_1$, $39X_2$, and the two Y heads $64y_2$, $64y_1$ that oppose the Y scales $39Y_1$, $39Y_2$, (FIG. 4).

Next, based on the measurement values of the abovementioned four encoders, the main control apparatus 20 moves the wafer stage WST by a prescribed distance in the +Y direction so that it is positioned at the position shown in FIG. 10A, uses the primary alignment system AL1 and the secondary alignment systems $AL2_2$, $AL2_3$ to substantially simultaneously, or separately, detect the alignment marks that are provided to the three first alignment shots AS (refer to the star symbols in FIG. 10A), and supplies the detection results of the abovementioned three alignment systems $AL_1$, $AL2_2$, $AL2_3$ and the measurement values of the abovementioned four encoders at the time of those detections to the alignment calculation system 20a so that they are associated. Furthermore, the secondary alignment systems $AL2_1$, $AL2_4$ on both ends, which do not detect alignment marks at this time, may either radiate or not radiate detection beams to the wafer table WTB (or the wafer). In addition, when wafer alignment is performed in the present embodiment, the wafer stage WST is set to a position in the X directions such that the primary alignment system AL1 is disposed along the center line of the wafer table WTB, and the primary alignment system AL1 detects the alignment mark of the alignment shot that is positioned along the centerline of the wafer. Furthermore, an alignment mark may be formed inside each of the shot regions on the wafer W; however, in the present embodiment, alignment marks are formed outside of each shot region, i.e., on street-lines (scribe lines) that partition the numerous shot regions of the wafer W.

Next, the main control apparatus 20 moves the wafer stage WST by a prescribed distance in the +Y direction based on the measurement values of the abovementioned four encoders so as to position the wafer stage WST at a position at which the five alignment systems AL1, $AL2_1$-$AL2_4$ can detect substantially simultaneously, or separately, the alignment marks that are provided to the five second alignment shots AS on the wafer W, uses the five alignment systems AL1, $AL2_1$-$AL2_4$ to detect the five alignment marks substantially simultaneously, or separately, and supplies the detection results of the abovementioned five alignment systems AL1, $AL2_1$-$AL2_4$ and the measurement values of the abovementioned four encoders at the time of that detection to the alignment calculation system 20a so that they are associated.

Next, the main control apparatus 20 moves the wafer stage WST by a prescribed distance in the +Y direction based on the measurement values of the abovementioned four encoders so as to position the wafer stage WST at a position at which the five alignment systems AL1, $AL2_1$-$AL2_4$ can detect substantially simultaneously, or separately, the alignment marks that are provided to the five third alignment shots AS on the wafer W, uses the five alignment systems AL1, $AL2_1$-$AL2_4$ to detect the five alignment marks (refer to the star symbols in FIG. 10B substantially simultaneously, or separately, and supplies the detection results of the abovementioned five alignment systems AL1, $AL2_1$-$AL2_4$ and the measurement values of the abovementioned four encoders at the time of that detection to the alignment calculation system 20a so that they are associated.

Next, the main control apparatus 20 moves the wafer stage WST by a prescribed distance in the +Y direction based on the measurement values of the abovementioned four encoders so as to position the wafer stage WST at a position at which the primary alignment systems AL1 and the secondary alignment systems $AL2_2$-$AL2_3$ can detect substantially simultaneously, or separately, the alignment marks that are provided to the three first alignment shots AS on the wafer W, uses the three alignment systems AL1, $AL2_2$-$AL2_3$ to detect the three alignment marks substantially simultaneously, or separately, and supplies the detection results of the abovementioned three alignment systems AL1, $AL2_2$-$AL2_3$ and the measurement values of the abovementioned four encoders at the time of that detection to the alignment calculation system 20a so that they are associated.

Furthermore, the alignment calculation system 20a uses the results of detecting the total of sixteen alignment marks obtained in this manner, the measurement values of the corresponding four encoders, and the baseline value of the primary alignment system AL1 and the secondary alignment system $AL2_n$ to perform EGA statistical calculation, as disclosed in, for example, Japanese Unexamined Patent Application Publication No. S61-44429 (corresponding U.S. Pat. No. 4,780,617), and calculates the layout of all of the shot regions on the wafer W within a stage coordinate system (e.g., an XY coordinate system wherein the optical axis AX of the projection optical system PL is the origin) defined by the measurement axes of the abovementioned four encoders (the four head units).

Thus, with the present embodiment, the wafer stage WST is moved in the +Y direction and is positioned at four locations along the movement pathway thereof, which makes it possible to obtain the position of the alignment mark of each of the sixteen alignment shots AS in a much shorter time period compared with the case wherein the sixteen alignment marks are sequentially detected using a single alignment system. In this case, it is particularly easy to see by examining, for example, the alignment systems AL1, $AL2_2$, $AL2_3$ that the alignment systems AL1, $AL2_2$, $AL2_3$ detect the plurality of the alignment marks, which are arrayed along the Y directions and disposed sequentially within the detection areas (e.g., corresponding to the irradiation areas of the detection beams), in connection with the abovementioned operation wherein the wafer stage WST is moved. Consequently, when the abovementioned alignment marks are measured, it is not necessary to move the wafer stage WST in the X directions, which makes it possible to perform alignment efficiently.

Next, under the control of the main control apparatus 20, a liquid immersion method and a step-and-scan method are used to expose all of the shot regions on the wafer W with the image of the pattern of the reticle R by using the measurement values of the head units 62A-62D (the encoders 70A-70D), which are based on the array coordinates, supplied from the alignment calculation system 20a to drive the wafer stage WST.

The operation and effects of the present embodiment are as described below.

(1) The measuring method that is performed by the exposure apparatus 100 in FIG. 1 measures the displacement of the wafer stage WST by detecting the scales $39X_1$, $39X_2$, $39Y_1$, $39Y_2$, which are provided to the wafer stage WST (movable member), using the plurality of X heads 66 and Y heads 64, and comprises: a step 201, wherein the plurality of X heads 66 and Y heads 64 are supported by the measurement frame 21 that has a linear thermal expansion coefficient that is smaller than that of the main body part—excepting the plate 28 wherein the scale $39X_1$ and the like of the wafer stage WST are formed; and a step 207 that measures the displacement of the wafer stage WST based on the detection results of the plurality of X heads 66 and Y heads 64.

In addition, the exposure apparatus 100 radiates the illumination light IL (exposure light) to the wafer W, which is held by the moveable wafer stage WST, forms the prescribed pattern on the wafer W, and comprises: the scales $39X_1$, $39Y_1$, and the like; the plurality of X heads 66 and Y heads 64, which detect the positions of the scales; the measurement frame 21, which integrally supports the plurality of X heads 66 and Y heads 64; and the switching control units 70Aa-70Da, which are disposed inside the encoders 70A-70D, that derive the displacement of the wafer stage WST based on the detection results of the plurality of X heads 66 and Y heads 64.

Accordingly, the X heads 66 and the Y heads 64 are used to detect the scales that are provided to the wafer stage WST, and consequently there is no need to provide optical paths with lengths that are on the same order as the stroke of the movable member as in the case of a laser interferometer, and it is possible to mitigate the effects of fluctuations in the refractive index of the ambient gas. In addition, if the scale $39X_1$ deviates from the detection target area of one of the X heads 66, measurement can proceed by switching to another X head 66 that is capable of detecting the scale $39X_1$. At this time, the coefficient of linear thermal expansion of the measurement frame 21 is smaller than that of the main body part of the wafer stage WST; consequently, even if the ambient temperature fluctuates, fluctuations in the positional relationships among the multiple X heads 66 are prevented, and it is possible to reduce measurement error when switching between the X heads 66. Accordingly, the positioning accuracy of the wafer stage WST and the overlay accuracy of the exposure apparatus are improved.

(2) In addition, the measurement frame 21 is formed from a material that has a coefficient of linear thermal expansion that is smaller than that of Invar. Accordingly, even if temperature of the measurement frame 21 varies to a certain extent, measurement error is kept small. Furthermore, the measurement frame 21 may be configured so that the multiple blocks are coupled by, for example, screw threads.

(3) In addition, a step 202 is executed, wherein the measurement frame 21 is supported via the vibration isolating members 23A-23C so that it is vibrationally isolated with respect to the floor surface and, in turn, the base plate 12, which comprises the guide surface of the wafer stage WST. Accordingly, measurement error does not occur in the X heads 66 or the Y heads 64 as a result of the impact of vibrations generated when the wafer stage WST is moved.

(4) In addition, a step 205 is executed, wherein the sensors 106XA-106ZC and the actuators 107XA-107ZC (FIG. 3) are used to prevent the displacement of the measurement frame 21 with respect to the floor surface and, in turn, the base plate 12, which comprises the guide surface of the wafer stage WST. Accordingly, even though the measurement frame 21 is supported via the vibration isolating members, the positions of the X heads 66 and the Y heads 64 are maintained stably, which improves measurement accuracy.

(5) In addition, a step 206 is executed, wherein the Y axis interferometer 16 and the X axis interferometer 126, which are at least part of the optical members of the wafer interferometer, are provided to the measurement frame 21 and measure the displacement of the wafer stage WST with respect to the measurement frame 21 (the projection optical system PL). Accordingly, it is possible to calibrate the measurement values that are produced by the Y heads 64 and the X heads 66 based on the measurement values that are produced by the Y axis interferometer 16 and the X axis interferometer 126.

(6) In addition, the scales 39X$_1$, 39Y$_1$ are periodic patterns in the shape of diffraction gratings; in addition, the X heads 66 and the Y heads 64 radiate detection beams to those periodic patterns and receive the interference lights of the multiple diffracted lights (1st order diffracted lights) generated by those periodic patterns. Accordingly, in addition to utilizing the short optical paths to mitigate the effects of turbulence, the X heads 66 and the Y heads 64 can measure the displacement of the wafer stage WST with a resolving power (accuracy) that is on par with that of the laser interferometers.

Furthermore, an encoder that can also be used for each of the encoders 70A-70D is a magnetic type linear encoder, which includes: a periodic magnetic scale wherein magnetism generating bodies, the poles of which reverse, are formed with a fine pitch; and a magnetic head that reads the magnetic scale.

Second Embodiment

Figure 12:
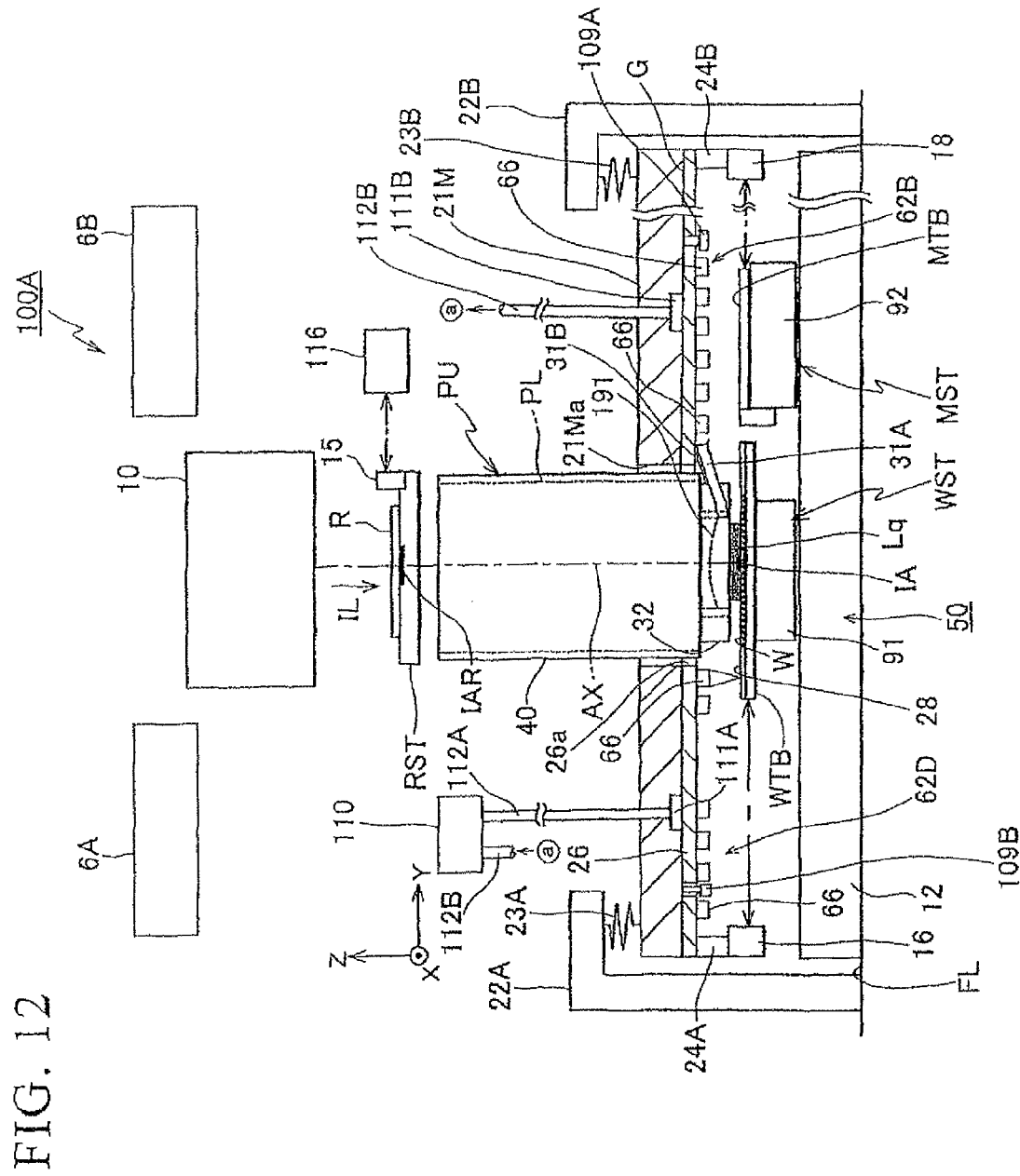
FIG. 12 is a partial cutaway view that shows a schematic configuration of the exposure apparatus according to a second embodiment.

The following explains a second embodiment of the present invention, referencing FIG. 12. In the present embodiment, the X heads 66 and the like (FIG. 1) are not directly supported by a measurement frame, but rather are supported by a member that is engaged with the measurement frame. Constituent components in FIG. 12 that correspond to those in FIG. 1 are assigned identical or similar symbols, and detailed descriptions thereof are omitted or simplified.

FIG. 12 shows an exposure apparatus 100A of the present embodiment. In FIG. 12, instead of the measurement frame 21 in FIG. 1, a flat plate-shaped measurement frame 21M is supported via the vibration isolating members 23A, 23B and the like so that it is suspended from the suspending members 22A, 22B and the like. In addition, a base (hereinbelow, called "head base") 26 for the flat plate-shaped encoder heads is vacuum chucked to the bottom surface of the measurement frame 21M. Numerous openings (not shown), which are for passing the gas that is supplied in a downflow therethrough, are formed in the measurement frame 21M and the head base 26 so that they have substantially the same positional relationship within the XY plane. In addition, openings 21Ma, 26a, which the lower end part of the projection unit PU passes through, are formed in the measurement frame 21M and the head base 26, respectively.

Furthermore, the plurality of X heads 66, which constitute the head units 62B, 62D (FIG. 4), and the plurality of Y heads 64 (not shown in FIG. 12), which constitute the head units 62A, 62C (FIG. 4), are fixed by a fixed member (not shown) to the bottom surface of the head base 26. The Y axis interferometers 16, 18 and the X axis interferometers 126, 130 (FIG. 2) are also fixed to the bottom surface of the head base 26. Furthermore, all of the alignment systems AL1, AL2$_1$-AL2$_4$ (FIG. 4) may be supported by the measurement frame 21M, and openings, wherethrough the tip parts of the alignment systems AL1, AL2$_1$-AL2$_4$, pass, may be provided to the head base 26. In addition, the optical system at least the tip part of each of the alignment systems AL1, AL2$_1$-AL2$_4$ may be supported by the head base 26.

In addition, similar to that shown in FIG. 5A, the X scales 39X$_1$, 39X$_2$ and the Y scales 39Y$_1$, 39Y$_2$ are also formed in the plate 28 of the wafer stage WST (FIG. 12). The X heads 66 and the Y heads 64 (not shown) at the bottom surface of the head base 26 (FIG. 12) detect the positions of the X scales 39X$_1$, 39X$_2$ and the Y scales 39Y$_1$, 39Y$_2$ and, in turn, the position of the wafer stage WST (the wafer table WTB).

In FIG. 12, the head base 26 is formed from a material with a coefficient of linear thermal expansion that is smaller than that of the members (the main body part of the wafer stage WST) of the wafer stage WST, excepting the plate 28 (wherein the scales 39Y$_1$, 39Y$_2$, 39X$_1$, 39X$_2$ in FIG. 5A are formed); namely, the head base 26 is formed from a material with an extremely small coefficient of linear thermal expansion. The material of the head base 26 is a low expansion glass or a low expansion glass ceramic, the same as that of the measurement frame 21 (FIG. 1). The head base 26 has a small shape with a thickness that is from ten percent to several tens percent that of the measurement frame 21M, which makes it possible to form the head base 26 easily using a low expansion glass or a low expansion glass ceramic.

Furthermore, the measurement frame 21M in FIG. 12 is formed from a material with a coefficient of linear thermal expansion that is larger than that of head base 26, but less than that of a metal such as regular iron; for example, the measurement frame 21M is formed from Invar, which has a coefficient of linear thermal expansion of approximately $1 \times 10^{-6}$/K. Using such a material makes it possible to form a large, integral measurement frame 21M easily. In addition, the same as in the measurement frame 21 of FIG. 3, six axial sensors 106XA-106ZC and six actuators 107XA-107ZC are provided to the measurement frame 21M, and thereby control can be performed so that the displacement with respect to the floor surface falls within the permissible range.

In addition, vacuum pads 111A, 111B and the like are provided to the bottom surface of the measurement frame 21M at a plurality of locations, and are connected to a chucking apparatus 110, which includes a compressor and a vacuum pump, via pipings 112A, 112B and the like. As a result of the positive and negative pressure from the chucking apparatus 110, the head base 26 is held to the bottom surface of the measurement frame 21M in the state wherein it can move smoothly within the XY plane (substantially the horizontal plane in the present embodiment) with a vacuum primed aerostatic bearing system so that an air layer G with a thickness of approximately several microns is interposed thereby.

However, in order to prevent the position of the head base 26 from gradually changing, the head base 26 is coupled to the measurement frame 21M in the state wherein it can be rotated by a bolt 109A at the measurement reference position. Furthermore, a bolt 109B couples the head base 26 to the measurement frame 21M via a long hole, which is formed in the head base 26, at a position at which the head base 26 is substantially symmetric with respect to its reference position and the projection optical system PL in the state wherein the head base 26 is capable of relative movement in the directions along the straight line that links the bolts 109A, 109B. Other aspects of the configuration are the same as those in the first embodiment (FIG. 1).

In addition to the operation and effects of the first embodiment, the present embodiment achieves the following operation and effects.

(1) In the present embodiment, the plurality of the X heads 66 and the like as well as the Y axis interferometers 16, 18 and the like are mounted to the bottom surface of the head base 26 in the step that corresponds to step 201 in FIG. 11. Furthermore, the head base 26 is coupled to the measurement frame 21M (the base member), which has a coefficient of linear thermal expansion that is larger than that of the head base 26, via the vacuum pads 111A, 111B and the like in the state wherein the head base 26 is capable of being displaced in directions along the front surface of the plate 28 (the X scales $39X_1$, $39X_2$ and the like) of the wafer stage WST.

Accordingly, the measurement frame 21M and the head base 26 can be formed easily from a material that has a low coefficient of expansion. Furthermore, it is assumed that the lengths of the measurement frame 21M and the head base 26 will differ as a result of slight temperature variations caused by differences in the coefficients of linear thermal expansion thereof. Even in such a case, the head base 26 can be displaced smoothly along the plate 28 (the measurement frame 21M) and around the bolt 109A, and consequently the head base 26 does not warp as a result of the bimetal effect. Accordingly, the X heads 66 and the like can measure the position of the wafer stage WST continuously with high precision.

(2) In addition, the head base 26 is coupled via the vacuum pads 111A, 111B (gas bearings) and the like in the state wherein it is not displaced relative to the measurement frame 21M at the position of the bolt 109A (the prescribed reference position). Accordingly, the position of the head base 26 does not change gradually.

(3) In addition, the head base 26 is coupled to the measurement frame 21M so that it can be displaced in the directions that link the bolts 109A, 109B. Accordingly, the head base 26 does not gradually rotate.

Furthermore, the head base 26 may be linked to the measurement frame 21M in the state wherein it can be displaced using, for example, a leaf spring instead of a bolt.

Third Embodiment

Figure 13:
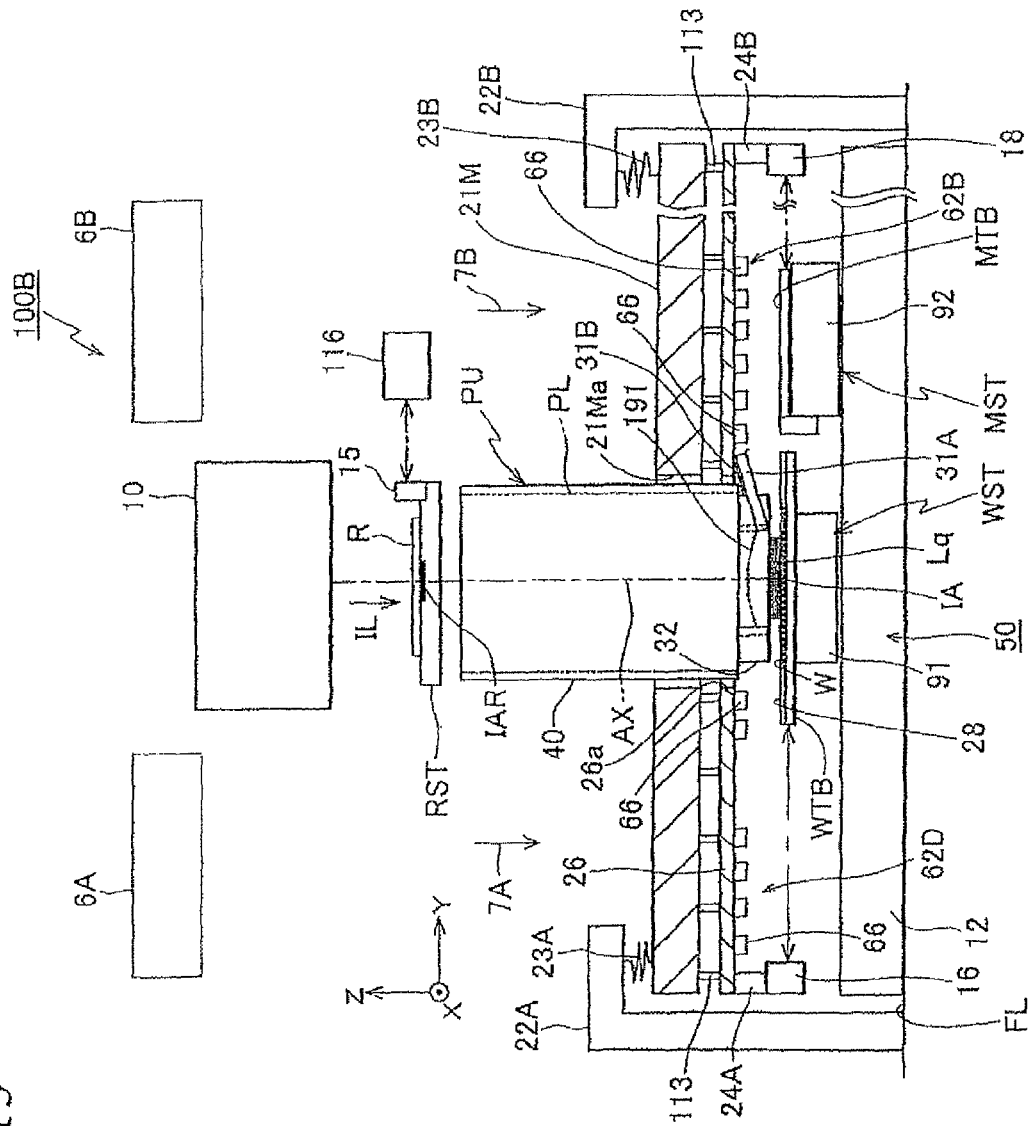
FIG. 13 is a partial cutaway view that shows a schematic configuration of an exposure apparatus according to a third embodiment.
Figure 14:
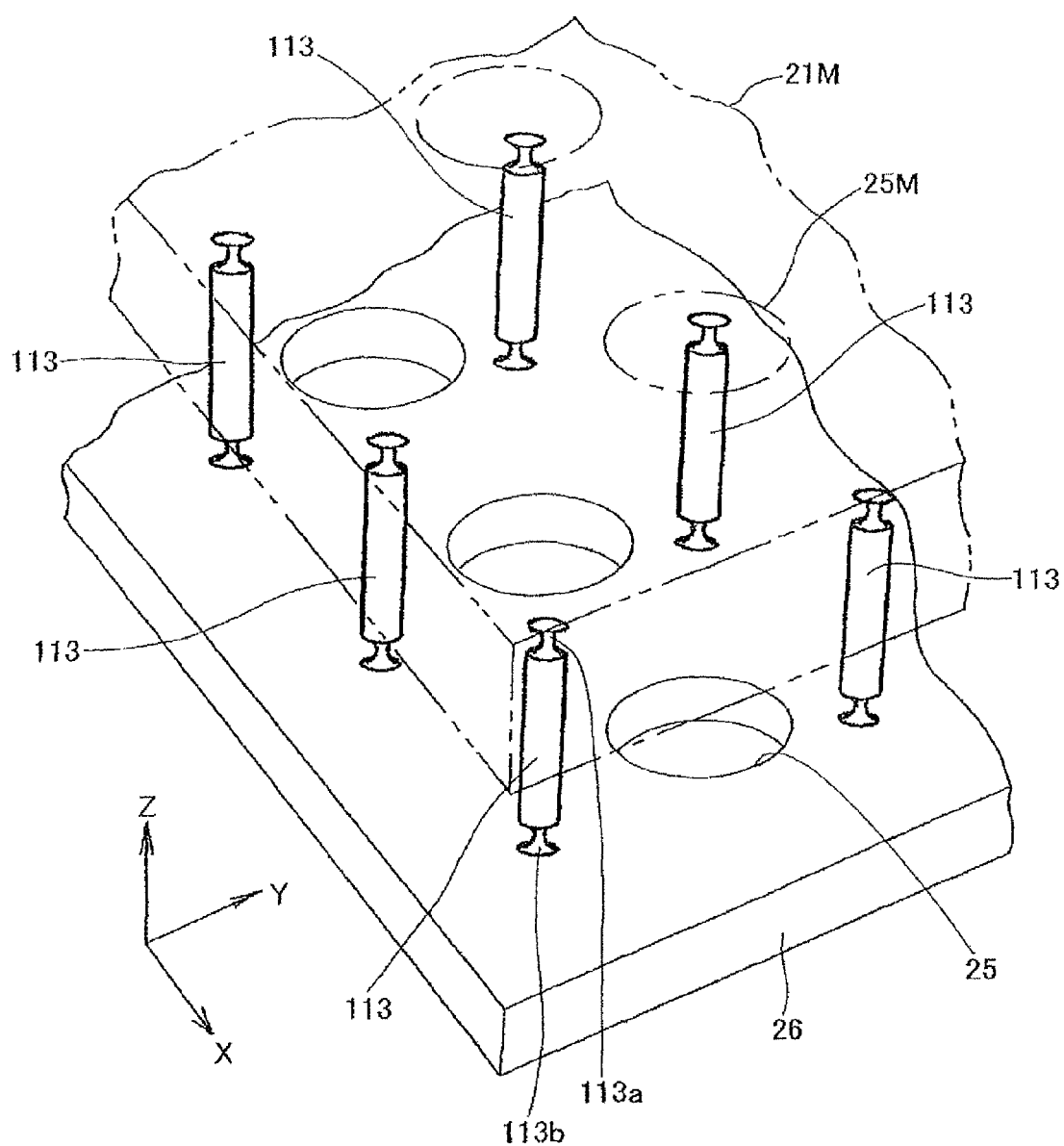
FIG. 14 is an enlarged oblique view of the principal parts of FIG. 13.
Figure 15:
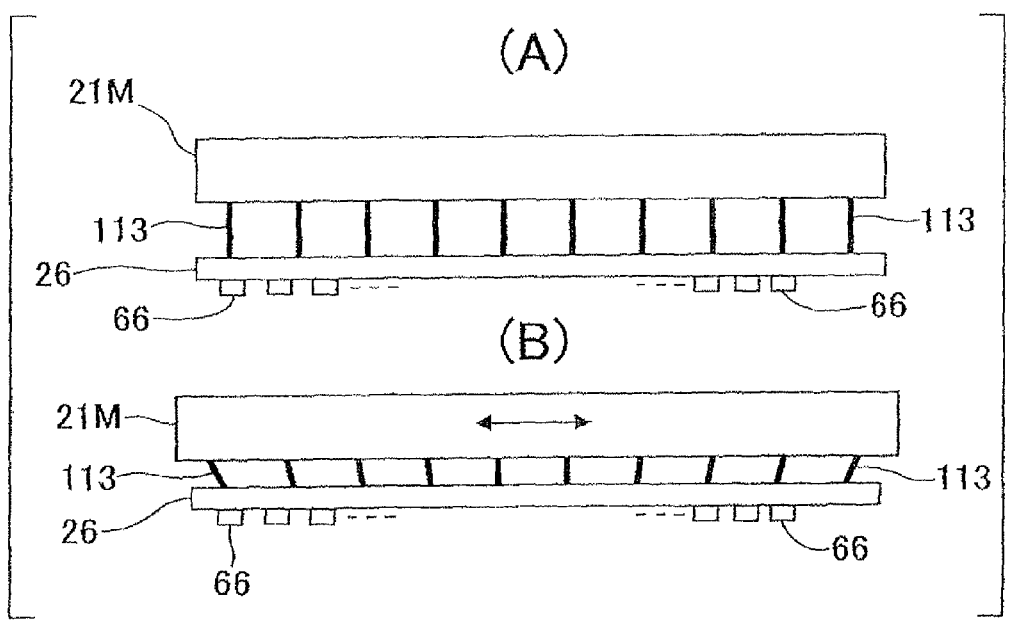
FIG. 15 is an explanatory diagram for explaining the operation in the case wherein the lengths of a measurement frame and a head base in FIG. 13 change.

The following explains a third embodiment of the present invention, referencing FIG. 13 through FIG. 15. In the present embodiment, the head base 26 is not coupled to the measurement frame 21M via gas bearings as in the embodiment shown in FIG. 12, but rather it is coupled more via a simpler flexural mechanism. Constituent components in FIG. 13 through FIG. 15 that are the same or similar to those in FIG. 12 are assigned the same symbols, and the explanations thereof are omitted.

FIG. 13 shows an exposure apparatus 100B of the present embodiment. In FIG. 13, the head base 26, whereto the X heads 66 and the like are fixed, is coupled to the bottom surface of the measurement frame 21M via numerous rod shaped flexural members 113, which are substantially disposed at prescribed intervals in the X directions and the Y directions, in the state wherein the head base 26 can be displaced in directions along the front surface of the plate 28 (wherein the X scales $39X_1$, $39X_2$ and the like of FIG. 5A are formed). In other words, the tip parts of the numerous flexural members 113 (the end parts on the head base 26 side) can be displaced within the ranges of their elastic deformations in directions along the X scales $39X_1$, $39X_2$ and the like.

FIG. 14 is an enlarged oblique view that shows part of the measurement frame 21M and the head base 26 in FIG. 13. As shown in FIG. 14, the flexural members 113 are rod shaped members, both ends of which easily deform, wherein circumferential notched parts (slotted parts) 113a, 113b are formed at the end parts thereof. In addition, numerous openings 25M, 25, wherethrough the gas that is supplied in a downflow passes, are formed in the measurement frame 21M and the head base 26. Other aspects of this configuration are otherwise similar to that of the embodiment in FIG. 12.

In the present embodiment, the flexural members 113, which are simple mechanisms, are used instead of a complicated mechanism like a vacuum chuck mechanism to couple the measurement frame 21M and the head base 26 in the state wherein deformation caused by differences in the coefficients of linear thermal expansion can be absorbed. In addition, the coefficient of linear thermal expansion of the head base 26 is smaller than that of the measurement frame 21M. At this time, it is assumed that differences in both of the coefficients of linear thermal expansion cause the measurement frame 21M to extend longer than the head base 26 from the state shown in part A in FIG. 15 to that shown in part B in FIG. 15 as a result of temperature variations. Even in this case, the deformation of the head base 26 (and, in turn, changes in the positional relationships among the multiple X heads 66 and the like) caused by elastic deformation of the numerous flexural members 113 can be kept to a minimum. Accordingly, even in the case wherein the measurement values of the X heads 66 in FIG. 13 are switched, the position of the wafer stage WST can be measured with high precision.

In addition, the coefficient of linear thermal expansion of the measurement frame 21M is larger than that of the head base 26, which makes it possible to use a material, such as Invar, that can be formed into a large member easily, which facilitates manufacturing. Furthermore, in the third embodiment, the coefficient of linear thermal expansion of the main body part of the wafer stage WST is smaller than or on the same order as that of the head base 26.

Furthermore, in the present embodiment, instead of the flexural members 113, it is also possible to use narrow, rod shaped members (flexural members with simple structures) 114 (FIG. 16A) or flexural members 115 (FIG. 16B), wherein slotted parts 115a are formed in the X directions and slotted parts 115b are formed in the Y directions of FIG. 13 at opposite end parts thereof, respectively.

Figure 17:
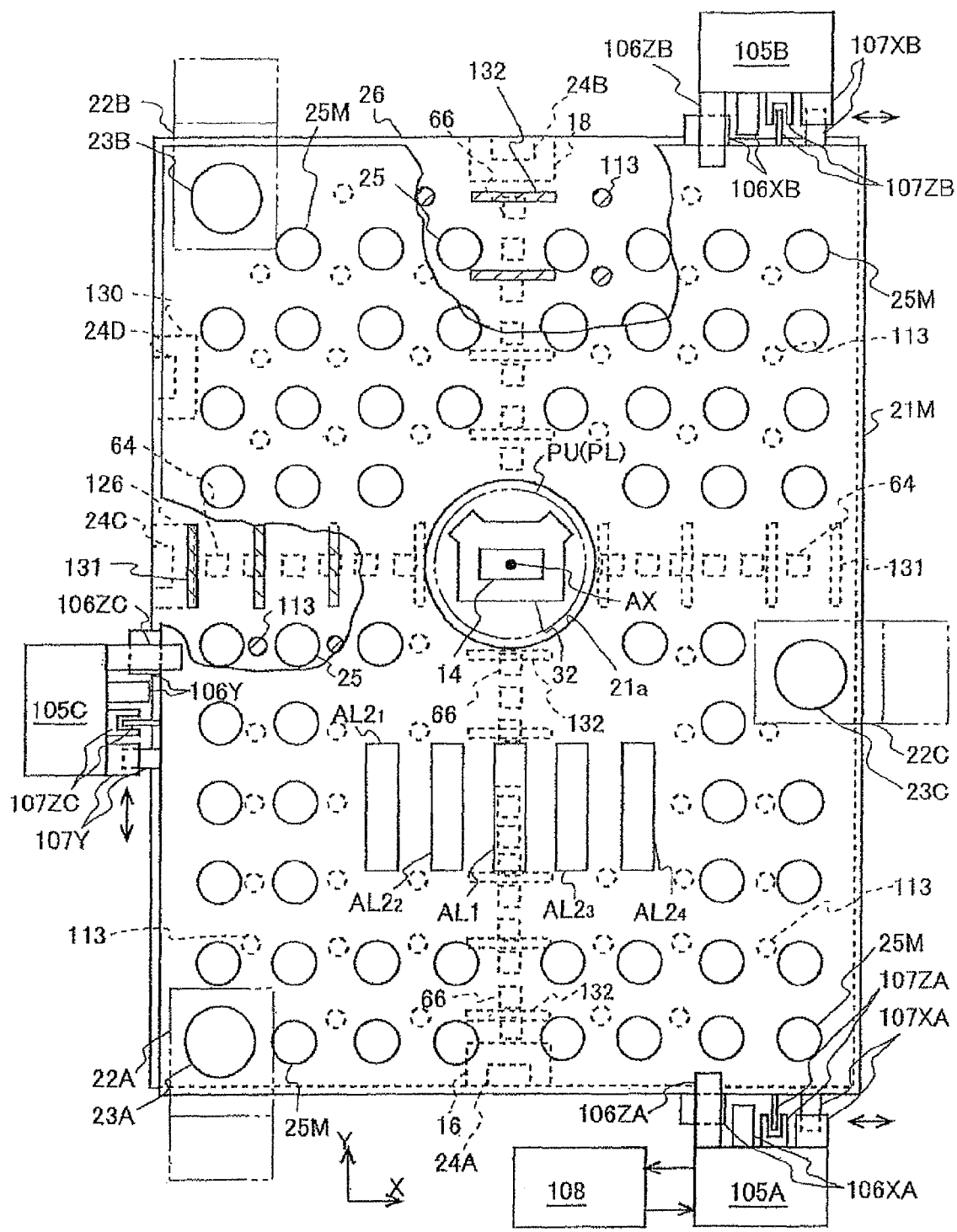
FIG. 17 is a partial cutaway plan view that shows a coupling method according to a modified example of FIG. 13.

In addition, as shown in the plan view of FIG. 17, the measurement frame 21M and the head base 26 may be coupled by: multiple leaf springs 131 that are substantially parallel to the YZ plane and are disposed so that they sandwich the projection unit PU in the X directions; multiple leaf springs 132 that are substantially parallel to the XZ plane and are disposed so that they sandwich the projection unit PU in the Y directions; and the flexural members 113, which are disposed substantially evenly at other portions. Thereby, it is possible to couple the head base 26 to the measurement frame 21M more stably.

In the above-described embodiments, the scales $39X_1$, $39Y_1$ are fixed to the wafer stage WST side, and the encoder heads 64, 66 are fixed to the measurement frame and the like. However, in another embodiment as shown in FIG. 19, the encoder heads 64, 66 can be fixed to the wafer stage WST side, and X scales $39AX_1$, $39AX_2$ can be fixed to the measurement frame 21S.

Figure 19:
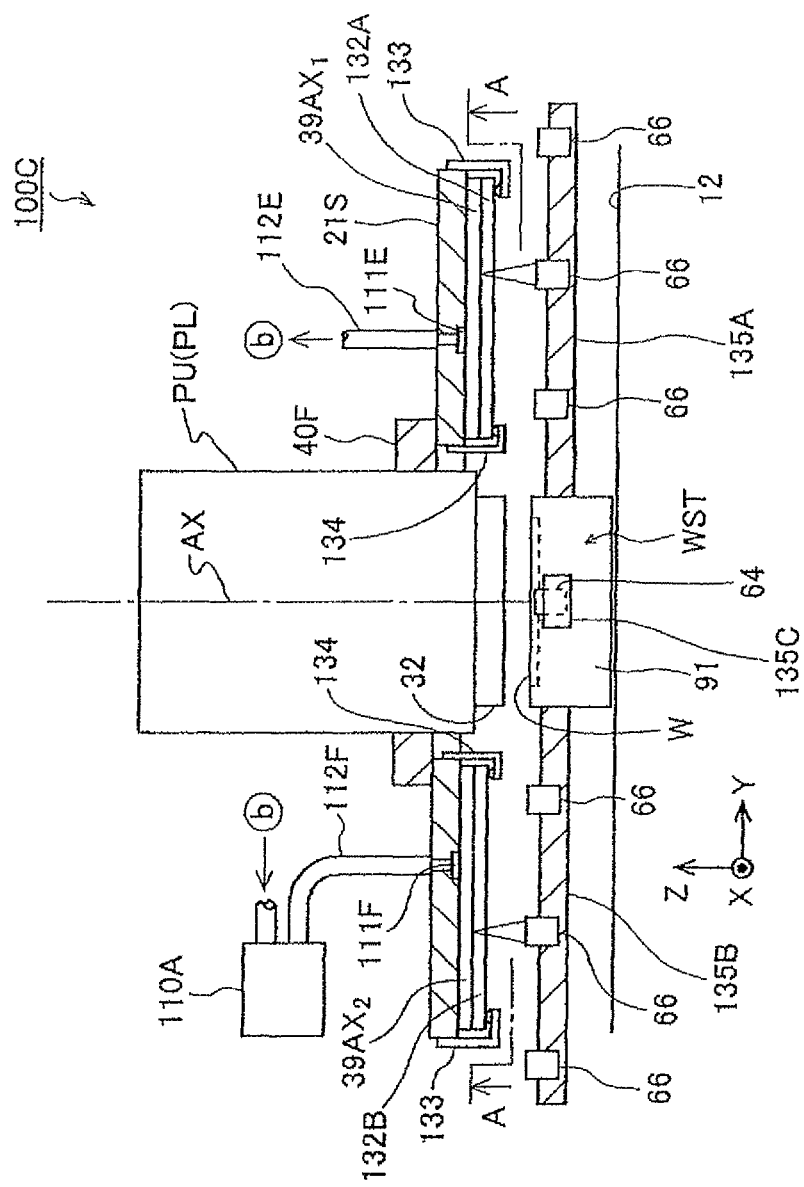
FIG. 19 is a partial cutaway view that shows a schematic configuration of the exposure apparatus according to another embodiment.

Specifically, in the exposure apparatus 100C shown in FIG. 19, a flange part 40F of the lens barrel for the projection unit PU (the projection optical system PL) is held by a mainframe (not shown). A measurement frame 21S, which has a plate shape and has an opening at the center portion thereof through which the projection unit PU can be passed, is fixed to the bottom surface of the flange part 40F. The measurement frame is made of same kind of a material of the above-described measurement and the like that has a low coefficient of linear thermal expansion. The two X scales $39AX_1$, $39AX_2$ are disposed at the bottom surface of the measurement frame 21S so that they sandwich the projection unit PU in the Y directions, and each have a rectangular plate shape and a grating(s) with a predetermined pitch in the X directions.

Figure 20:
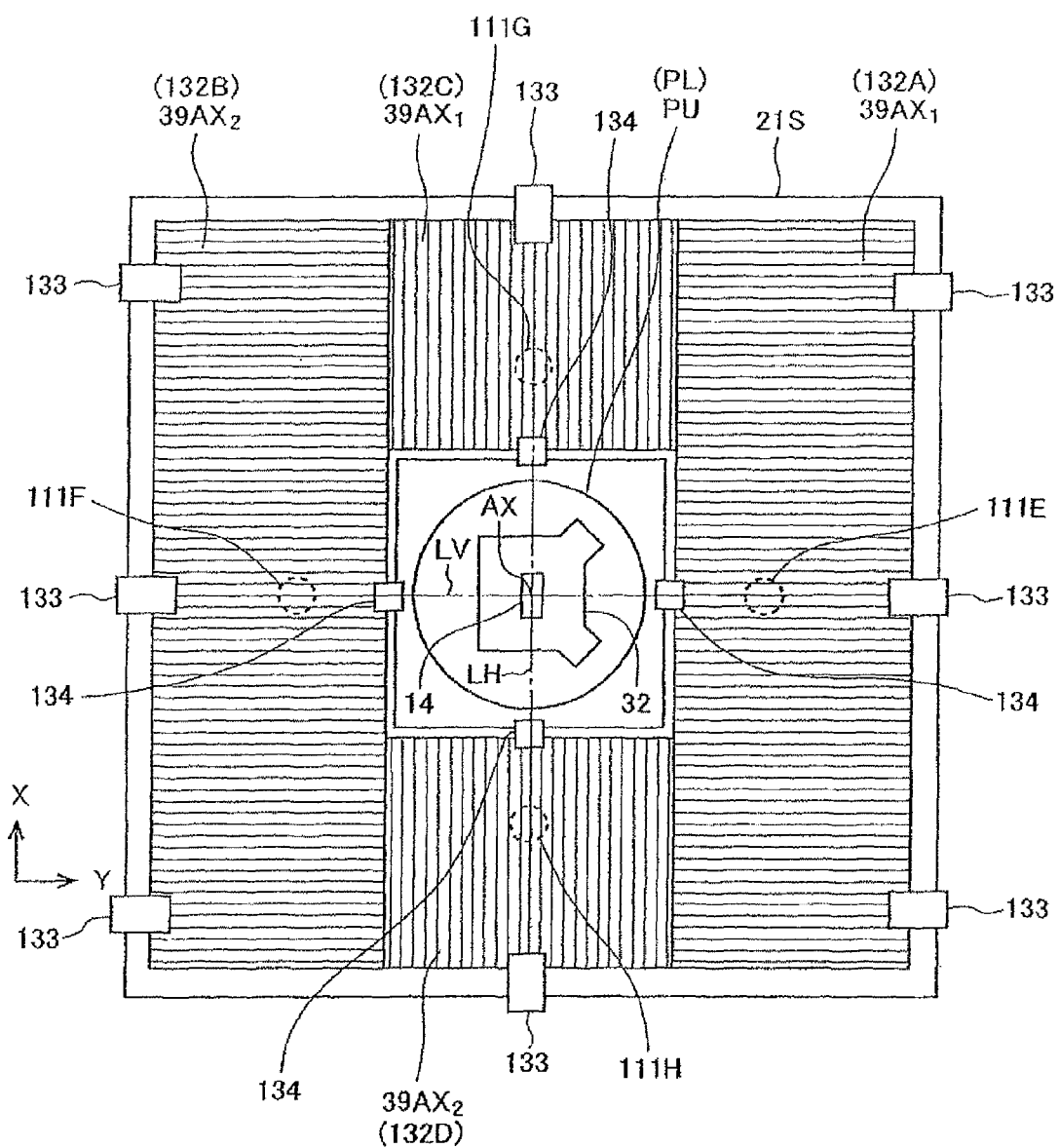
FIG. 20 is a bottom view along A-A shown in FIG. 19.

As shown in FIG. 20 that is a bottom view along A-A shown in FIG. 19, two Y scales $39AY_1$, $39AY_2$ are disposed at the bottom surface of the measurement frame 21S so that they sandwich the projection unit PU in the X directions, and each have a grating(s) with a predetermined pitch in the Y directions. Protective glass members 132A, 132B, 132C, 132D have substantially the same as and cover the X scales $39AX_1$, $39AX_2$ and the Y scales $39AY_1$, $39AY_2$, respectively. Each of the protective glass members 132A, 132B, 132C, 132D is held by the measurement frame 21S with attachments 133, 134 and with elastic force which allows the movement of the scales $39AX_1$, $39AX_2$, $39AY_1$, or $39AY_2$ as a result of the thermal deformation thereof or the like. Furthermore, vacuum pads 111G, 111H are disposed at the Y scales $39AY_1$, $39AY_2$ and along a straight line LH, which is parallel to the X axis and passes through the center of the optical axis AX of the projection unit PU (the center of the exposure area), and vacuum pads 111E, 111F are disposed at the X scales $39AX_1$, $39AX_2$ and along a straight line LV, which is parallel to the Y axis and passes through the same.

The vacuum pads 111E-111H are connected to a suction apparatus 110A, which includes a vacuum pump, via the holes in the measurement frame 21S and via pipings 112E, 112F shown in FIG. 19 and the like. During the exposure, the scales $39AX_1$, $39AX_2$, $39AY_1$, $39AY_2$ are held to the measurement frame 21S by the suction of the suction apparatus 110A via the vacuum pads 111E-111H. Thus, the scales $39AX_1$, $39AX_2$, $39AY_1$, $39AY_2$ are secured by means of the vacuum pads 111E-111H; therefore, the deviation with respect to the center of exposure area can be prevented, and highly positional measurement with respect to the projection unit PU as the bases can be achieved.

Two detection frames 135A, 135B extending in the Y directions are secured so that they sandwich the stage main body 91 of the wafer stage WST in the Y directions. Two detection frames 135C, 135D (135D is not shown) extending in the X direction are secured so that they sandwich the main body 91 in the X directions. A plurality of X heads 66 that detect the X scales $39AX_1$, $39AX_2$, are provided with a predetermined pitch on the detection frame 135A, 135B. A plurality of Y heads 64 that detect the Y scales $39AY_1$, $39AY_2$, are provided with a predetermined pitch on the detection frame 135C, 135C. When the wafer stage WST moves in the X directions or the Y directions, the scales $39AX_1$, $39AX_2$, $39AY_1$, $39AY_2$ are detects by the plurality of X heads 66 and Y heads 64 with switching; as a result, the position of the wafer stage WST can be measured with high precision. It is preferable that the measurement frame 135A-135D be made of a material, which has a low coefficient of linear thermal expansion such as Super Invar and the like.

Figure 18:
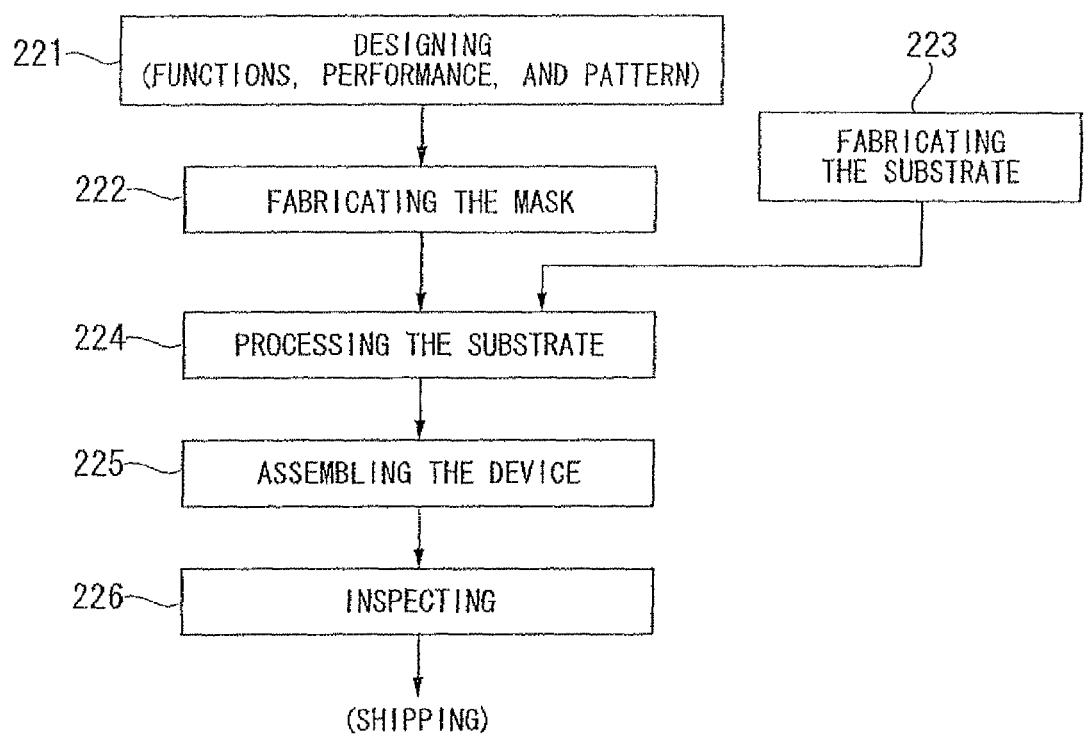
FIG. 18 is a flow chart that shows one example of a microdevice fabricating process.

Furthermore, when a microdevice, such as a semiconductor device, is fabricated using the exposure apparatus according to the abovementioned embodiments, it is fabricated as shown in FIG. 18 by, for example: a step 221 that designs the functions and performance of the microdevice; a step 222 that fabricates a mask (reticle) based on the design step; a step 223 that fabricates a substrate, which is the base material of the device; a substrate processing step 224 that includes, for example, a process that uses the exposure apparatus 100 (projection exposure apparatus) according to the embodiments discussed above to expose the substrate with the pattern of the reticle, a process that develops the exposed substrate, and a process that heats (cures) and etches the developed substrate; a device assembling step 225 (comprising fabrication processes, such as a dicing process, a bonding process, and a packaging process); and an inspecting step 226.

In other words, the device fabricating method includes a lithographic process, wherein the exposure apparatus according to the abovementioned embodiments is used in the lithographic process. At this time, even if the wafer stage moves at high speed, it is unaffected by interferometer turbulence; furthermore, even if the temperature fluctuates to a certain extent, the encoders can measure the position of the wafer stage with high precision, which makes it possible to improve exposure accuracy, e.g., overlay accuracy, and to mass produce devices with high precision and high throughput.

Furthermore, the present invention can also be adapted to, for example, a step-and-scan scanning type projection exposure apparatus (scanner) as well as a step-and-repeat projection exposure apparatus (stepper and the like) and other fabrication tools. Furthermore, the present invention can similarly be adapted to exposure apparatuses other than the liquid immersion type, e.g., to a dry exposure type exposure apparatus.

In addition, the present invention is not limited to a semiconductor device fabrication exposure apparatus, but can also be adapted to: an exposure apparatus that is used for fabricating displays, such as liquid crystal devices and plasma displays, and that transfers a device pattern onto a glass plate; an exposure apparatus that is used in the fabrication of thin film magnetic heads and that transfers a device pattern onto a ceramic wafer; and an exposure apparatus that is used for fabricating, for example, image capturing devices (CCDs), organic electroluminescent devices, micromachines, MEMS (microelectromechanical systems), and DNA chips. In addition to microdevices, such as semiconductor devices, the present invention can also be adapted to an exposure apparatus that transfers a circuit pattern to, for example, a glass substrate or a silicon wafer in order to fabricate a mask that is used by a visible light exposure apparatus, an EUV exposure apparatus, or the like.

Thus, the present invention is not limited to the embodiments discussed above, and it is understood that variations and modifications may be effected without departing from the spirit and scope of the invention.

According to some embodiments of the present invention, the detectors are used to detect the scales that are provided to the moveable member (or stage), and consequently there is no need to provide optical paths with lengths that are on the same order as the stroke of the movable member as in the case of a laser interferometer, and it is possible to mitigate the effects of fluctuations in the refractive index of the ambient gas. In addition, if the scale of the moveable member deviates from the detection target area of one of the detectors, measurement can proceed by, for example, switching to another detector that is capable of detecting that scale. At this time, the coefficient of linear thermal expansion of the support member is smaller than that of the moveable body or the base member; consequently, even if the ambient temperature fluctuates, fluctuations in the positional relationships among the multiple detectors are prevented, and it is possible to reduce measurement error when switching between the detectors. Accordingly, the positioning accuracy of the stage is improved for the case of an exposure apparatus.

What is claimed is:

1. An exposure apparatus that exposes a substrate with illumination light via a projection optical system, the apparatus comprising:
   a frame structure that supports the projection optical system;
   a plurality of grating members each of which has a reflecting-type grating portion, and that are suspended and supported by the frame structure such that the grating portion is arranged in substantially parallel with a predetermined face perpendicular to an optical axis of the projection optical system;
   a stage having a holder to hold the substrate and being movable below the grating members, the holder being provided within a concave portion that is formed in an upper surface of the stage; and
   an encoder system provided at the stage and having a plurality of heads each of which is configured to radiate beam to the grating portions from below the grating portions, so as to obtain position information of the stage,
   wherein each of the heads is provided at the stage and located at a more outward position than the upper surface of the stage.

2. The exposure apparatus according to claim 1,
   wherein the stage has a frame member to which the heads are fixed, and that extends in a more outward direction than the upper surface.

3. The exposure apparatus according to claim 2,
   wherein the frame member is configured to extend, with respect to the stage, in radial directions different from each other.

4. The exposure apparatus according to claim 3,
   wherein the grating members are supported by the frame structure so as to be movable in a parallel direction with the predetermined face.

5. The exposure apparatus according to claim 4,
   wherein each of the grating members has a protective member that covers the grating portion.

6. The exposure apparatus according to claim 1, further comprising:
   a nozzle unit provided at a lower end side of the projection optical system and having an opening through which the illumination light passes at a lower surface side toward which the stage is arranged to face, and configured to form a liquid immersion area between the projection optical system and a portion of the substrate,
   wherein the grating members are arranged at a more outward position than the nozzle unit, and
   wherein the substrate is exposed with the illumination light via the projection optical system and a liquid of the liquid immersion area.

7. The exposure apparatus according to claim 6,
   wherein the nozzle unit has a flat surface in which the opening is formed at a lower surface side of the nozzle unit.

8. The exposure apparatus according to claim 6,
   wherein the grating members are arranged surrounding the nozzle unit, and arranged such that the grating portion is positioned higher than a lower surface of the nozzle unit.

9. The exposure apparatus according to claim 8,
   wherein the nozzle unit has, at a lower surface side of the nozzle unit, a recovery port arranged surrounding the opening through which the illumination light passes, and
   wherein a liquid is supplied to the liquid immersion area via the nozzle unit and a liquid is recovered from the liquid immersion area via the recovery port.

10. The exposure apparatus according to claim 6, further comprising:
    a support member that is different from the frame structure, and supports the nozzle unit.

11. A method for producing a device comprising:
    exposing a substrate by using the exposure apparatus according to claim 1; and
    developing the exposed substrate.

12. The exposure apparatus according to claim 1,
    wherein the holder is provided within the concave portion that is formed in the upper surface of the stage such that an upper surface of the substrate is substantially flush with the upper surface of the stage.

13. An exposure method that exposes a substrate with illumination light via a projection optical system, the method comprising:
    moving a stage provided with a holder to hold the substrate within a concave portion that is formed in an upper surface of the stage, below a plurality of grating members suspended and supported by a frame structure, the frame structure supporting the projection optical system such that a reflecting-type grating portion is arranged in substantially parallel with a predetermined face perpendicular to an optical axis of the projection optical system;
    obtaining position information of the stage, by an encoder system provided at the stage and having a plurality of heads each of which is configured to radiate beam to the grating portions from below the grating portions; and
    controlling a position of the stage, based on the measured position information, wherein
    each of the heads is provided at the stage and located at a more outward position than the upper surface of the stage.

14. The exposure method according to claim 13,
    wherein the stage has a frame member to which the heads are fixed, and that extends in a more outward direction than the upper surface.

15. The exposure method according to claim 14,
    wherein the frame member is configured to extend, with respect to the stage, in radial directions different from each other.

16. The exposure method according to claim 15,
wherein the grating members are supported by the frame structure so as to be movable in a parallel direction with the predetermined face.

17. The exposure method according to claim 16,
wherein each of the grating members is radiated by the beam via a protective member that covers the grating portion.

18. The exposure method according to claim 13,
wherein a liquid immersion area is formed between the projection optical system and a portion of the substrate, by a nozzle unit provided at a lower end side of the projection optical system and having an opening through which the illumination light passes at a lower surface side toward which the stage is arranged to face, and the substrate is exposed with the illumination light via the projection optical system and a liquid of the liquid immersion area,
wherein the grating members are arranged at a more outward position than the nozzle unit.

19. The exposure method according to claim 18,
wherein the nozzle unit has a flat surface in which the opening is formed at a lower surface side of the nozzle unit.

20. The exposure method according to claim 18,
wherein the grating members are arranged surrounding the nozzle unit, and arranged such that the grating portion is positioned higher than a lower surface of the nozzle unit.

21. The exposure method according to claim 20,
wherein a liquid is supplied to the liquid immersion area via the nozzle unit, and a liquid is recovered from the liquid immersion area via a recovery port arranged, at a lower surface side of the nozzle unit, surrounding the opening.

22. The exposure method according to claim 18,
wherein the nozzle unit is supported by a support member that is different from the frame structure.

23. A method for producing a device comprising:
exposing a substrate by using the exposure method according to claim 13; and
developing the exposed substrate.

24. The exposure method according to claim 13,
wherein the holder is provided within the concave portion that is formed in the upper surface of the stage such that an upper surface of the substrate is substantially flush with the upper surface of the stage.

25. A method for producing an exposure apparatus that exposes a substrate with illumination light via a projection optical system, the method comprising:
providing a frame structure that supports the projection optical system;
providing a plurality of grating members each of which has a reflecting-type grating portion, and that are suspended and supported by the frame structure such that the grating portion is arranged in substantially parallel with a predetermined face perpendicular to an optical axis of the projection optical system;
providing a stage having a holder to hold the substrate and being movable below the grating members, the holder being provided within a concave portion that is formed in an upper surface of the stage; and
providing an encoder system provided at the stage and having a plurality of heads each of which is configured to radiate beam to the grating portions from below the grating portions, so as to obtain position information of the stage,
wherein each of the heads is provided at the stage and located at a more outward position than the upper surface of the stage.

26. The method according to claim 25,
wherein the holder is provided within the concave portion that is formed in the upper surface of the stage such that an upper surface of the substrate is substantially flush with the upper surface of the stage.

* * * * *